(12) United States Patent
Aoki et al.

(10) Patent No.: US 12,250,773 B2
(45) Date of Patent: Mar. 11, 2025

(54) WIRING BOARD AND WIRING BOARD MANUFACTURING METHOD

(71) Applicant: SHINKO ELECTRIC INDUSTRIES CO., LTD., Nagano (JP)

(72) Inventors: Toshiaki Aoki, Nagano (JP); Toyoaki Sakai, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 41 days.

(21) Appl. No.: 17/858,163

(22) Filed: Jul. 6, 2022

(65) Prior Publication Data

US 2023/0009751 A1    Jan. 12, 2023

(30) Foreign Application Priority Data

Jul. 6, 2021    (JP) .................................. 2021-112310
Feb. 7, 2022    (JP) .................................. 2022-017380

(51) Int. Cl.
*H05K 1/11*    (2006.01)
*H05K 1/18*    (2006.01)
(Continued)

(52) U.S. Cl.
CPC ............. *H05K 1/186* (2013.01); *H05K 1/115* (2013.01); *H05K 3/0094* (2013.01); *H05K 3/422* (2013.01);
(Continued)

(58) Field of Classification Search
CPC ........ H05K 1/112; H05K 1/113; H05K 1/115; H05K 1/116; H05K 1/165; H05K 2201/09563; H05K 2201/09536; H05K 2201/09545; H05K 2201/09645; H05K 2201/0979; H05K 2201/09818; H05K 2201/09881; H05K 2201/09909; H05K 2201/09972; H05K 2201/0959; H05K 2201/086; H05K 2201/10295;
(Continued)

(56) References Cited

U.S. PATENT DOCUMENTS 3,354,260 A * 11/1967 Brandt .................. B29C 65/601
                                                      174/265
7,868,728 B2 * 1/2011 Mano ...................... H01F 17/06
                                                      336/200
(Continued)

FOREIGN PATENT DOCUMENTS

JP    01-162281    6/1989
JP    2007-012746    1/2007
JP    2019-220504    12/2019

*Primary Examiner* — Roshn K Varghese
(74) *Attorney, Agent, or Firm* — Rankin, Hill & Clark LLP

(57) ABSTRACT

A wiring board includes a base material, a through hole that is formed in the base material, a magnetic member that is embedded in the through hole, and a plating film that covers end faces of the magnetic member exposed from the through hole. The magnetic member includes a conductor wire that is covered by a magnetic body. A wiring board manufacturing method includes forming a through hole in a base material, forming a magnetic member by covering a conductor wire by a magnetic body, embedding the magnetic member in the through hole, and forming a plating film that covers end faces of the magnetic member exposed from the through hole.

24 Claims, 34 Drawing Sheets

(51) Int. Cl.
*H05K 3/00* (2006.01)
*H05K 3/42* (2006.01)

(52) U.S. Cl.
CPC ............... *H05K 2201/0212* (2013.01); *H05K 2201/086* (2013.01); *H05K 2201/0959* (2013.01); *H05K 2201/1003* (2013.01); *H05K 2203/072* (2013.01)

(58) Field of Classification Search
CPC . H05K 2201/10303; H05K 2201/1031; H05K 2201/10287; H05K 3/4046; H01F 2017/002
See application file for complete search history.

(56) References Cited

U.S. PATENT DOCUMENTS

| | | | |
|---|---|---|---|
| 10,939,561 B1* | 3/2021 | Huang | H05K 3/0026 |
| 2019/0279806 A1* | 9/2019 | Darmawikarta | H01F 27/2804 |
| 2019/0287815 A1* | 9/2019 | Xu | H01F 41/24 |
| 2021/0183562 A1* | 6/2021 | Kawai | H01F 27/2804 |

\* cited by examiner

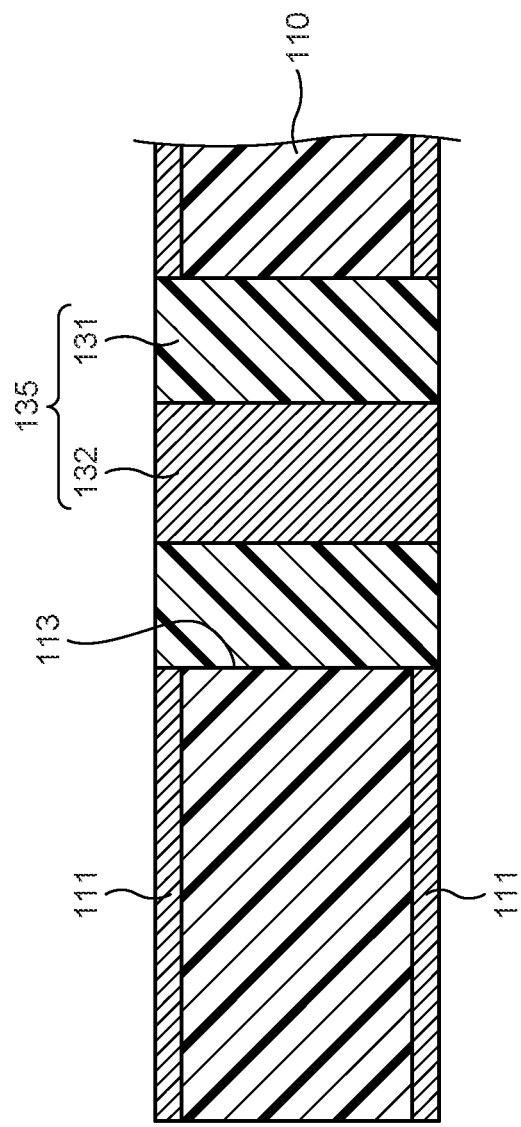
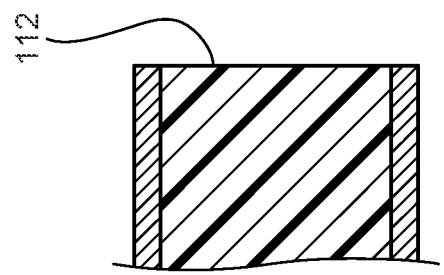
FIG.9

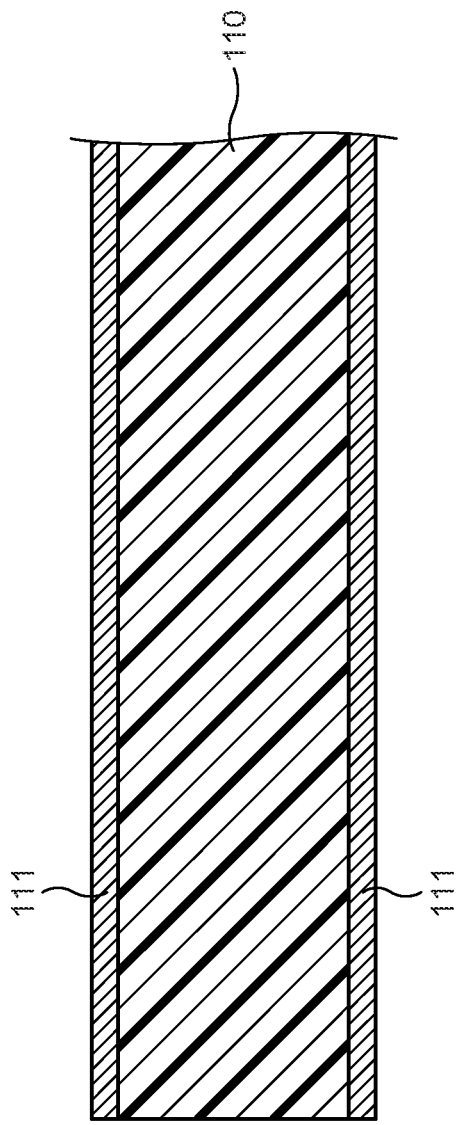
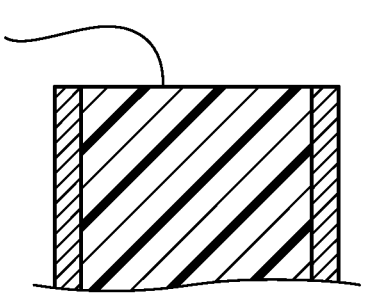
FIG.21

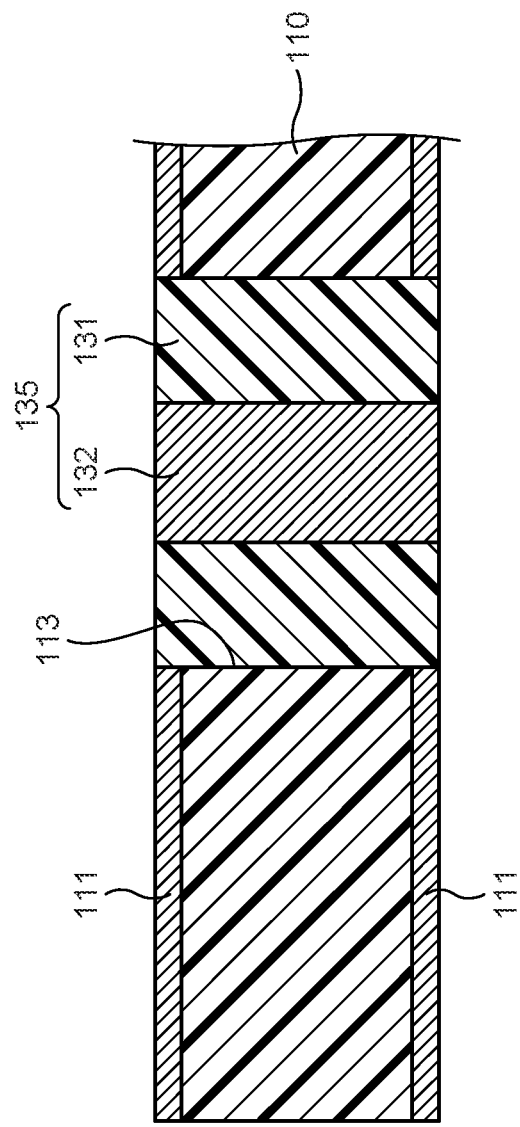
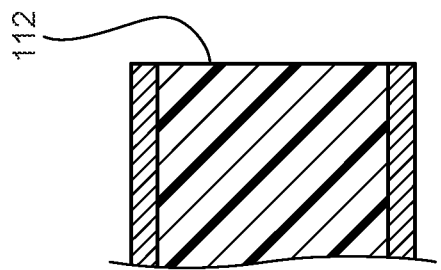
FIG.32

WIRING BOARD AND WIRING BOARD MANUFACTURING METHOD

CROSS-REFERENCE TO RELATED APPLICATION

This application is based upon and claims the benefit of priority of the prior Japanese Patent Application No. 2021-112310, filed on Jul. 6, 2021 and Japanese Patent Application No. 2022-017380, filed on Feb. 7, 2022, the entire contents of which are incorporated herein by reference.

FIELD

The embodiments discussed herein are related to a wiring board and a wiring board manufacturing method.

BACKGROUND

Conventionally, a wiring board that includes a built-in inductor that is formed by using a magnetic body is known. The inductor as described above is formed by, for example, housing a magnetic body in a through hole in an insulating resin layer of the wiring board, forming a through hole in the magnetic body by drilling, and forming a plating film on an inner wall of the through hole. It is common to perform a process of forming the plating film on the inner wall of the through hole of the magnetic body by, for example, electro copper plating at the same time of forming a plating film on a surface of the wiring board.

Patent Literature 1: Japanese Laid-open Patent Publication No. H1-162281
Patent Literature 2: Japanese Laid-open Patent Publication No. 2007-12746
Patent Literature 3: Japanese Laid-open Patent Publication No. 2019-220504

However, in the wiring board as described above, a process of forming the inductor is complicated and therefore, due to an influence of an error that occurs in each of processes, improvement in electrical characteristics of the inductor is limited, which is a problem. Specifically, the through hole is formed in the magnetic body by, for example, drilling, but it may be difficult to form the through hole in the center of the magnetic body depending on accuracy of the drilling. As a result, a position of the plating film that is formed on the inner wall of the through hole of the magnetic body may deviate, and variation in the inductance increases.

Furthermore, the through hole that is formed on an inner side of the plating film and that penetrates through the magnetic body is normally filled with insulating resin. Moreover, because both ends of the insulating resin are exposed from surfaces of the wiring board, plating films are laminated on the surfaces of the wiring board to cover the both ends of the insulating resin. Furthermore, when the through hole is formed in the wiring board, a plating film for covering the inner wall of the through hole is further laminated on a surface of the wiring board. In this manner, the plurality of plating films are laminated on the surfaces of the wiring board, so that a plate thickness in the vicinity of the inductor may become uneven, and electrical characteristics of the inductor are degraded.

SUMMARY

According to an aspect of an embodiment, a wiring board includes a base material, a through hole that is formed in the base material, a magnetic member that is embedded in the through hole, and a plating film that covers end faces of the magnetic member exposed from the through hole, wherein the magnetic member includes a conductor wire that is covered by a magnetic body.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9 is a diagram illustrating a specific example of a surface polishing process;

FIG. 21 is a diagram illustrating a specific example of a through hole forming process;

FIG. 32 is a diagram illustrating a specific example of a through hole forming process;

DESCRIPTION OF EMBODIMENTS

Embodiments of a wiring board and a wiring board manufacturing method disclosed in the present application will be described in detail below with reference to the drawings. The present invention is not limited by the embodiments below.

First Embodiment

Figure 1:
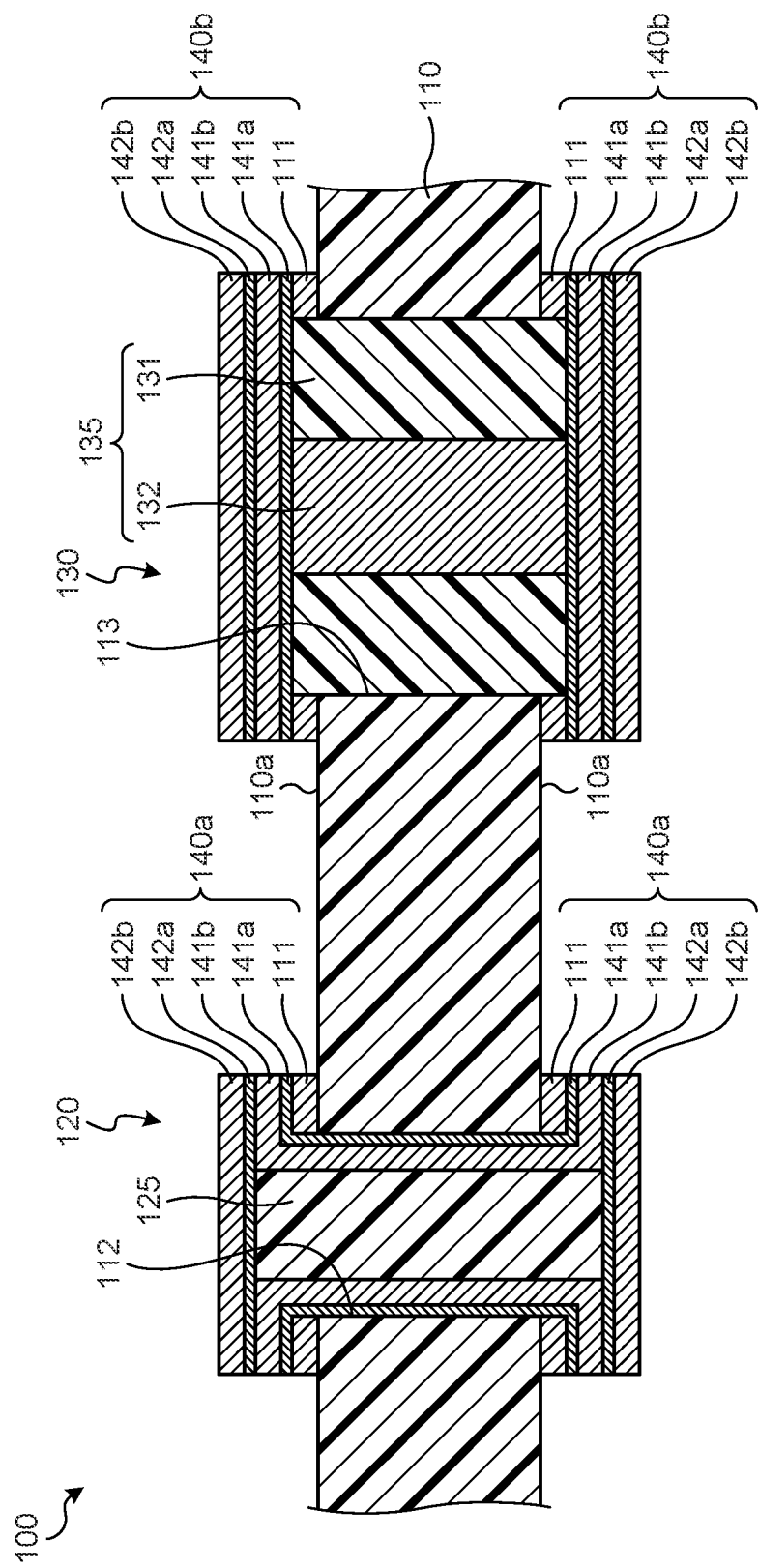
FIG. 1 is a partial cross-sectional view illustrating a configuration of a core substrate according to a first embodiment.

FIG. 1 is a partial cross-sectional view illustrating a configuration of a core substrate 100 that is included in a multi-layer wiring board according to a first embodiment. As illustrated in FIG. 1, the core substrate 100 is a wiring board that includes a base material 110, a through hole portion 120, and an inductor portion 130.

The base material 110 is a base material of the core substrate 100 and includes a plate member that has insulating property. As the base material 110, for example, a glass epoxy substrate, in which insulating resin, such as epoxy resin or polyimide resin, is impregnated in a glass cloth, or the like may be used. Further, it may be possible to use, as the base material 110, a substrate in which epoxy resin or the like is impregnated in a woven fabric or a non-woven fabric that is made of a glass fiber, a carbon fiber, or the like, for example. A thickness of the base material 110 may be set to, for example, about 700 to 2000 micrometers (nm).

The through hole portion 120 is arranged at a position of a through hole 112 that penetrates through the base material 110, and ensures conduction between surfaces 110a on both sides of the base material 110. The through hole portion 120 includes conductor layers 140a that are formed on the surfaces 110a of the base material 110, and insulating resin 125 that penetrates through the through hole 112.

Each of the conductor layers 140a includes a metallic foil 111, a first electroless plating film 141a, a first electroplating film 141b, a second electroless plating film 142a, and a second electroplating film 142b, and forms a pad of the through hole portion 120. The pads formed of the conductor layers 140a are included in wiring layers that are arranged on the surfaces of the base material 110. The metallic foils 111 are metallic foils that are arranged on the surfaces 110a of the base material 110 in advance and that are removable by etching. As the metallic foils 111, for example, copper foils, copper alloy foils, or the like may be used, and a thickness of each of the metallic foils 111 is, for example, 4 to 12 μm.

The first electroless plating films 141a and the second electroless plating films 142a are electroless plating films that are formed by, for example, copper electroless plating. In contrast, the first electroplating films 141b and the second electroplating films 142b are electroplating films that are formed by, for example, electro copper plating. The first electroless plating films 141a are laminated on the metallic foils 111, and cover an inner wall of the through hole 112. The first electroplating films 141b are laminated on the first electroless plating films 141a. The second electroless plating films 142a are laminated on the first electroplating films 141b, and cover end faces of the insulating resin 125. The second electroplating films 142b are laminated on the second electroless plating films 142a.

The insulating resin 125 is insulating resin that is filled in an inner through hole on inner sides of the first electroless plating films 141a and the first electroplating films 141b that cover the inner wall of the through hole 112. As the insulating resin 125, for example, epoxy resin containing filler, such as silica, may be used. Both end faces of the insulating resin 125 are covered by the second electroless plating films 142a and the second electroplating films 142b.

The inductor portion 130 is arranged at a position of a through hole 113 that penetrates through the base material 110, and functions as an inductor. The inductor portion 130 includes conductor layers 140b that are formed on the surfaces 110a of the base material 110, and a magnetic member 135 that penetrates through the through hole 113.

Each of the conductor layers 140b includes, similarly to the conductor layers 140a, the metallic foil 111, the first electroless plating film 141a, the first electroplating film 141b, the second electroless plating film 142a, and the second electroplating film 142b, and forms a pad of the inductor portion 130. The pads formed of the conductor layers 140b are included in the wiring layers that are arranged on the surfaces of the base material 110.

In the inductor portion 130, the first electroless plating films 141a, the first electroplating films 141b, the second electroless plating films 142a, and the second electroplating films 142b are laminated on the metallic foils 111, and cover end faces of the magnetic member 135. In other words, the first electroless plating films 141a are formed so as to cover the metallic foils 111 and the end faces of the magnetic member 135, and the first electroplating films 141b, the second electroless plating films 142a, and the second electroplating films 142b are laminated in this order on the first electroless plating films 141a.

Meanwhile, the first electroless plating films 141a, the first electroplating films 141b, the second electroless plating films 142a, and the second electroplating films 142b of the conductor layers 140a and 140b are electroless plating films or electroplating films that are formed simultaneously.

The magnetic member 135 is a member that includes a magnetic body and a conductor, and is embedded in the through hole 113 that is formed in the base material 110. Specifically, the magnetic member 135 is, for example, a member that is formed by covering a conductor wire 132 by a magnetic body 131, and is formed so as to have a certain size that fits to the through hole 113. The both end faces of the magnetic member 135 are covered by the first electroless plating films 141a, the first electroplating films 141b, the second electroless plating films 142a, and the second electroplating films 142b.

Figure 2A:
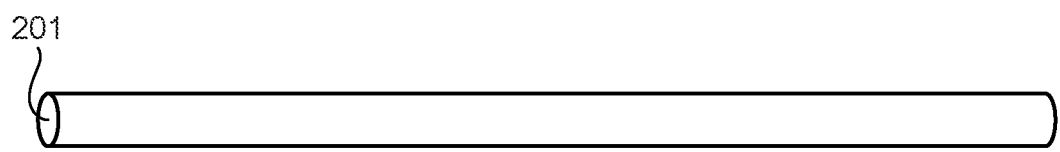
FIG. 2A is a diagram illustrating a specific example of a method of forming a magnetic member.
Figure 2B:
FIG. 2B is a diagram illustrating a specific example of a method of forming a magnetic member.
Figure 2C:
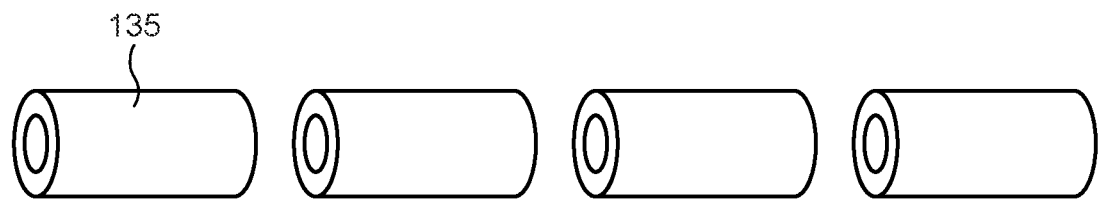
FIG. 2C is a diagram illustrating a specific example of a method of forming a magnetic member.

The configuration of the magnetic member 135 will be described below using a specific example. FIGS. 2A to 2C are diagrams illustrating a specific example of a method of forming the magnetic member 135. The magnetic member 135 illustrated in FIGS. 2A to 2C is formed by covering a conductor wire by a magnetic body.

Specifically, a conductor wire 201 illustrated in FIG. 2A for example is covered by a magnetic body 202 as illustrated in FIG. 2B, so that a magnetic-body-covered conductor wire is formed. As the conductor wire 201, for example, a metal wire, such as a copper wire, may be used.

As the magnetic body 202, for example, insulating resin, such as epoxy resin, that contains magnetic particles may be used. Examples of the magnetic particles include filler, such as iron, iron oxide, cobalt iron oxide, silicon iron, nickel, nickel oxide, magnetic alloy, or ferrite. If resin containing magnetic filler as described above is used as the magnetic body 202, for example, a periphery of the conductor wire 201 with a diameter of about 100 to 200 μm is covered by the magnetic body 202 with a thickness of about 75 to 175 μm. Consequently, it is possible to form the magnetic-body-covered conductor wire with a diameter of 250 to 550 μm, for example.

Furthermore, as the magnetic body 202, for example, magnetic metal, such as iron, nickel, or chromium, may be used. If the magnetic metal as described above is used as the magnetic body 202, for example, a plating film formed of the magnetic body 202 with the thickness of about 50 to 200 μm is formed around the conductor wire 201 with the diameter of 50 to 300 μm by electroplating. Consequently, it is possible to form the magnetic-body-covered conductor wire with the diameter of 150 to 700 μm, for example.

A diameter of each of the magnetic-body-covered conductor wires as described above is approximately the same as a diameter of the through hole 113 of the base material 110 in which the magnetic member 135 is embedded, but it is preferable that the diameter is slightly larger than the diameter of the through hole 113.

After the magnetic-body-covered conductor wire is formed, the magnetic-body-covered conductor wire is cut to a predetermined length as illustrated in FIG. 2C for example. Specifically, the magnetic-body-covered conductor wire is cut to approximately the same length, such as 700 to 2000 μm, as the thickness of the base material 110, so that the magnetic member 135 is obtained. At this time, it is preferable that the length of the magnetic member 135 is slightly longer than the thickness of the base material 110 such that when the magnetic member 135 is embedded in the through hole 113, both ends of the magnetic member 135 protrude from the surfaces of the base material 110.

FIGS. 3A to 3E are diagrams illustrating another specific example of the method of forming the magnetic member 135. The magnetic member 135 illustrated in FIGS. 3A to 3E is formed by forming a strand wire by twisting a plurality of magnetic-body-covered conductor wires together, and covering the strand wire by insulating resin.

Figure 3A:
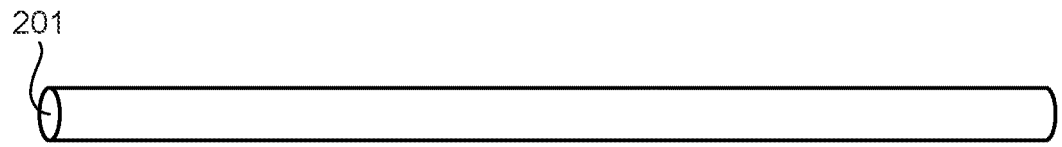
FIG. 3A is a diagram illustrating another specific example of the method of forming the magnetic member.
Figure 3B:
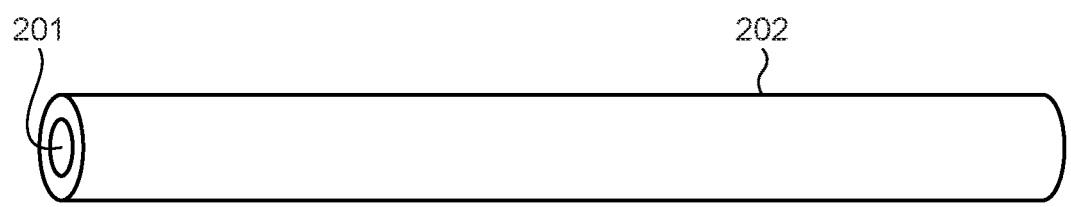
FIG. 3B is a diagram illustrating another specific example of the method of forming the magnetic member.

Specifically, the conductor wire 201 as illustrated in FIG. 3A for example is covered by the magnetic body 202 as illustrated in FIG. 3B, so that a magnetic-body-covered conductor wire is formed. As the conductor wire 201, for example, a copper wire may be used. As the magnetic body 202, similarly to the above, resin that contains magnetic filler or magnetic metal may be used, for example.

Figure 3C:
FIG. 3C is a diagram illustrating another specific example of the method of forming the magnetic member.
Figure 3D:
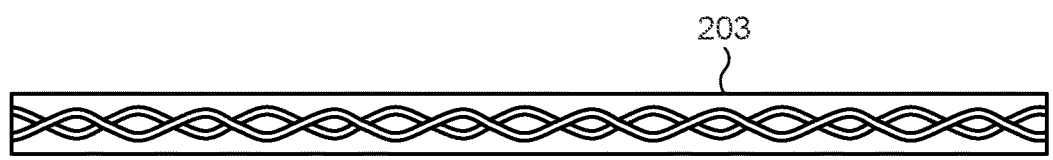
FIG. 3D is a diagram illustrating another specific example of the method of forming the magnetic member.
Figure 3E:
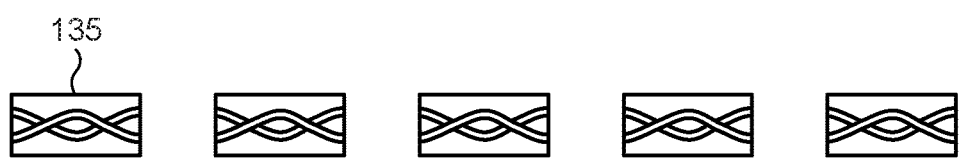
FIG. 3E is a diagram illustrating another specific example of the method of forming the magnetic member.

After the plurality of magnetic-body-covered conductor wires are formed as described above, the plurality of magnetic-body-covered conductor wires are twisted together as illustrated in FIG. 3C, so that a strand wire is formed. Further, the strand wire is covered by insulating resin 203 as illustrated in FIG. 3D. The strand wire covered by the insulating resin 203 is cut to a predetermined length as illustrated in FIG. 3E for example. Specifically, the strand wire covered by the insulating resin 203 is cut to approximately the same length, such as 700 to 2000 μm, as the thickness of the base material 110, so that the magnetic member 135 is obtained. At this time, it is preferable that the length of the magnetic member 135 is slightly longer than the thickness of the base material 110 such that when the magnetic member 135 is embedded in the through hole 113, the both ends of the magnetic member 135 protrude from the surfaces of the base material 110.

Figure 4A:
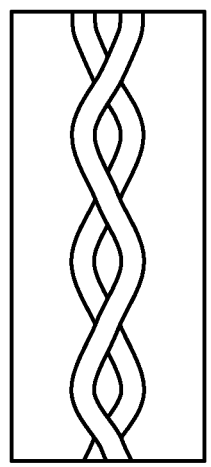
FIG. 4A is a diagram illustrating a specific example of a configuration of the magnetic member.
Figure 4B:
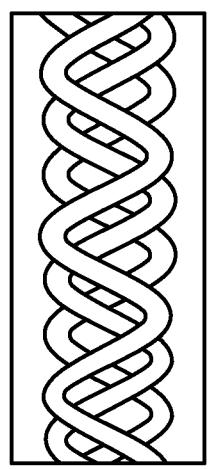
FIG. 4B is a diagram illustrating a specific example of a configuration of the magnetic member.

When the magnetic member 135 is formed by using the strand wire, an arbitrary number of magnetic-body-covered conductor wires may be twisted together. Specifically, it may be possible to form the magnetic member 135 from a strand wire having a double helix structure in which two magnetic-body-covered conductor wires are twisted together as illustrated in FIG. 4A for example, or it may be possible to form the magnetic member 135 from a strand wire having a triple helix structure in which three magnetic-body-covered conductor wires are twisted together as illustrated in FIG. 4B for example.

The magnetic member 135 as described above is formed by using the magnetic-body-covered conductor wire in which the conductor wire 201 is arranged in the center of the magnetic body 202, and the conductor wire 201 and the magnetic body 202 are uniformly arranged. As a result, in the core substrate 100 in which the magnetic member 135 is embedded in the base material 110, it is possible to reduce variation of inductance of the inductor portion 130. Further, the conductor wire 201 is included in the center of the magnetic member 135, so that a volume of the conductor in the magnetic member 135 increases and it is possible to reduce electrical resistance. In this manner, with use of the magnetic member 135, it is possible to improve electrical characteristics of the built-in inductor that is included in the core substrate 100.

Furthermore, the conductor wire 201 is included in the magnetic member 135 in advance, so that after the magnetic member 135 is embedded in the base material 110, a plating process of establishing electrical connection of the both ends of the magnetic member 135 is not needed. Therefore, it is possible to simplify the process of manufacturing the core substrate 100, and reduce the number of plating processes, so that it is possible to make a plating thickness uniform.

Each of the electroless plating films and the electroplating films will be described below.

The first electroless plating films 141a are formed on the surfaces of the metallic foils 111, an inner wall surface of the through hole 112, and the end faces of the magnetic member 135. Specifically, in the through hole portion 120, the first electroless plating films 141a are formed on the surfaces of the metallic foils 111 and the inner wall surface of the through hole 112 in a continuous manner. In contrast, in the inductor portion 130, the first electroless plating films 141a are laminated on the surfaces of the metallic foils 111 and the end faces of the magnetic member 135. A thickness of each of the first electroless plating films 141a is, for example, about 0.1 to 2.0 μm.

The first electroplating films 141b are laminated on the first electroless plating films 141a. Specifically, in the through hole portion 120, the first electroplating films 141b are laminated on the first electroless plating films 141a on an upper side and a lower side of the metallic foils 111 and the inner side of the through hole 112 in a continuous manner. In contrast, in the inductor portion 130, the first electroplating films 141b are laminated on the first electroless plating films 141a in a planar manner. A thickness of each of the first electroplating films 141b is, for example, about 2 to 18 μm.

The second electroless plating films 142a are formed on the surfaces of the first electroplating films 141b and the end faces of the insulating resin 125. Specifically, in the through hole portion 120, the second electroless plating films 142a are laminated on the first electroplating films 141b and the end faces of the insulating resin 125. In contrast, in the inductor portion 130, the second electroless plating films 142a are laminated on the first electroplating films 141b in a planar manner. A thickness of each of the second electroless plating films 142a is, for example, about 0.1 to 2.0 μm, similarly to the first electroless plating films 141a.

The second electroplating films 142b are laminated on the second electroless plating films 142a. Specifically, in the through hole portion 120 and the inductor portion 130, the second electroplating films 142b are laminated on the second electroless plating films 142a in a planar manner. A thickness of each of the second electroplating films 142b is, for example, about 2 to 18 μm, similarly to the first electroplating films 141b.

Figure 5:
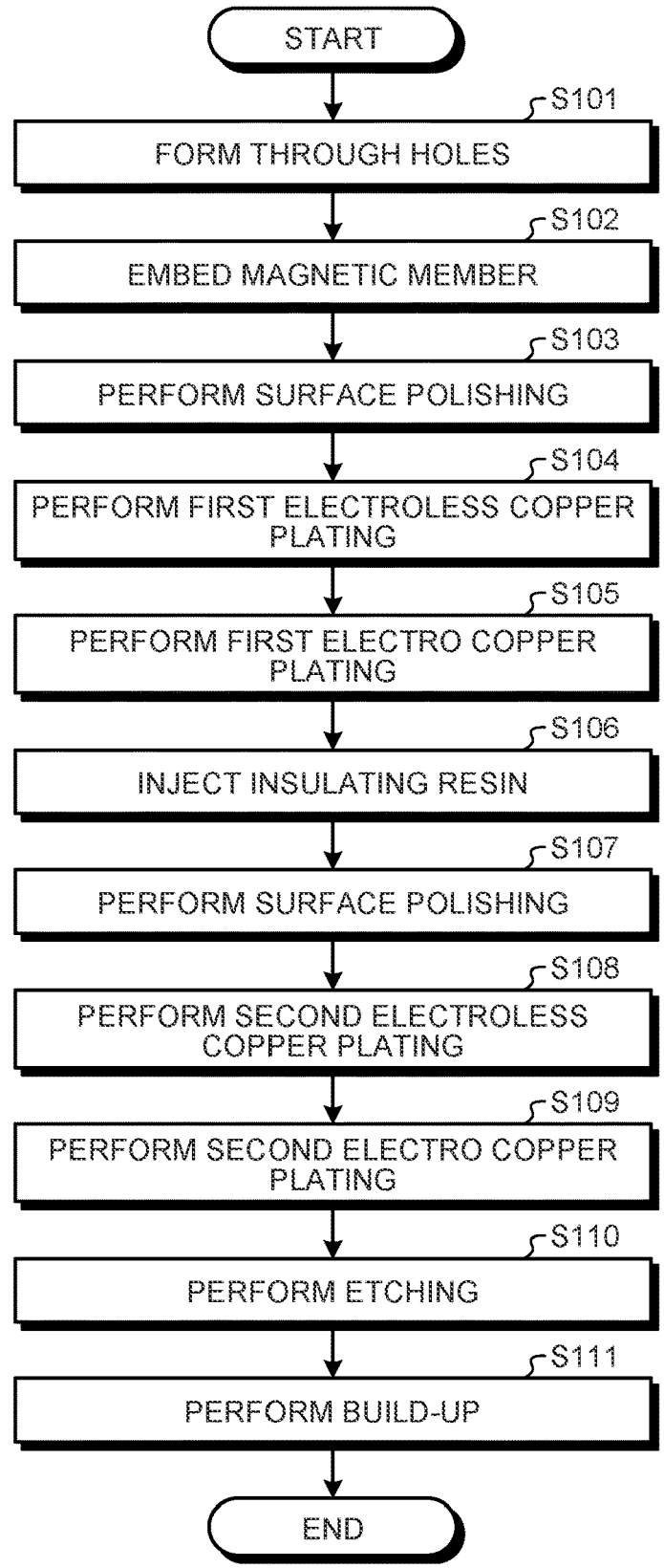
FIG. 5 is a flowchart illustrating a wiring board manufacturing method according to the first embodiment.

A method of manufacturing a multi-layer wiring board including the core substrate 100 that is configured as described above will be described below with reference to a flowchart illustrated in FIG. 5 by using a specific example.

Figure 6:
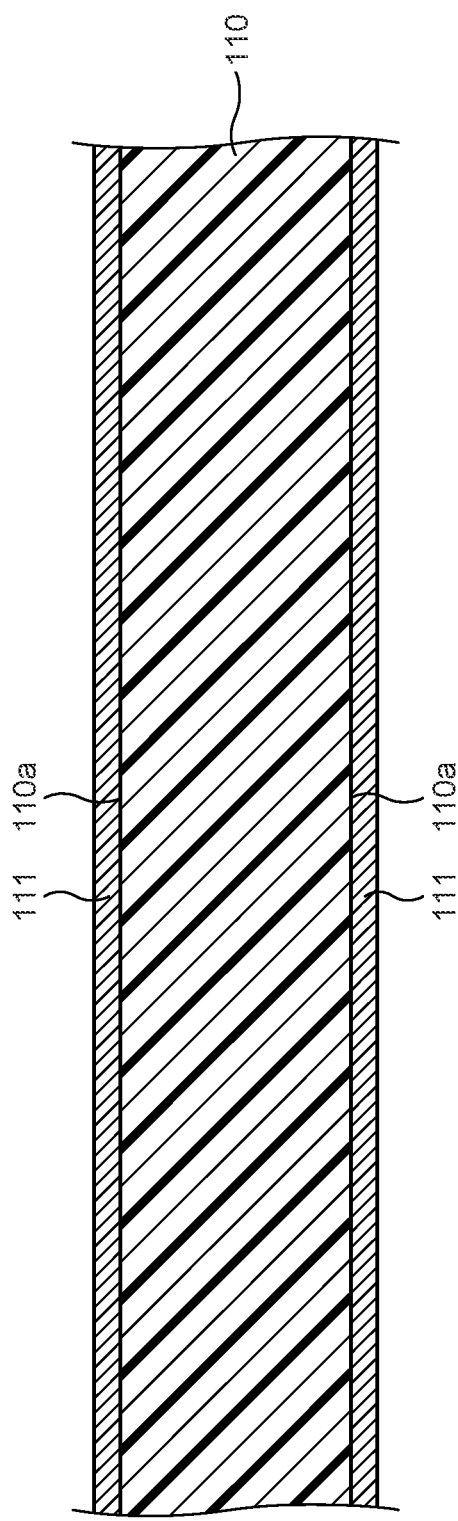
FIG. 6 is a diagram illustrating a configuration of a base material.
Figure 7:
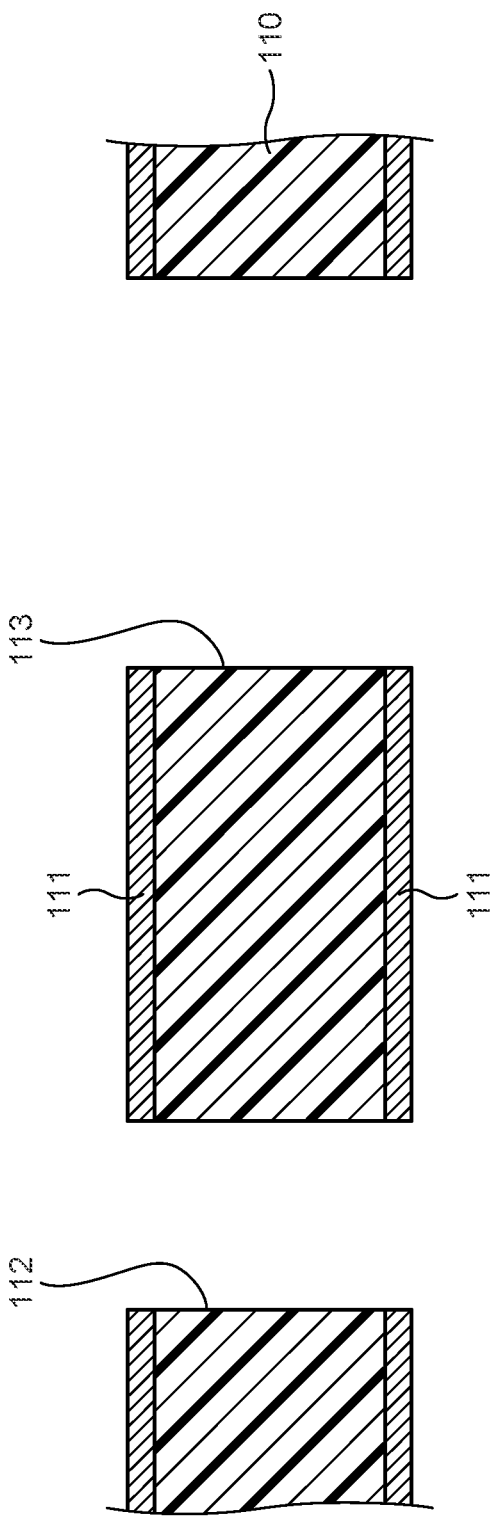
FIG. 7 is a diagram illustrating a specific example of a through hole forming process.

First, the through holes 112 and 113 for forming the through hole portion 120 and the inductor portion 130 are formed in the base material 110 that includes an insulating plate member (Step S101). The base material 110 is obtained by forming the metallic foils 111 on the surfaces 110a of the insulating plate member as illustrated in FIG. 6, for example. A thickness of the base material 110 is, for example, about 700 to 2000 μm. The through hole 112 having a cylindrical shape in which a diameter of an opening portion is about 100 to 200 μm and the through hole 113 having a cylindrical shape in which a diameter of an opening portion is about 250 to 550 μm are formed in the base material 110 as illustrated in FIG. 7, for example. The through holes 112 and 113 are formed by, for example, laser processing or drilling, and after the through holes 112 and 113 are formed, desmear processing for removing resinous residue on inner wall surfaces is performed. In the desmear processing, for example, a potassium permanganate solution may be used.

Figure 8:
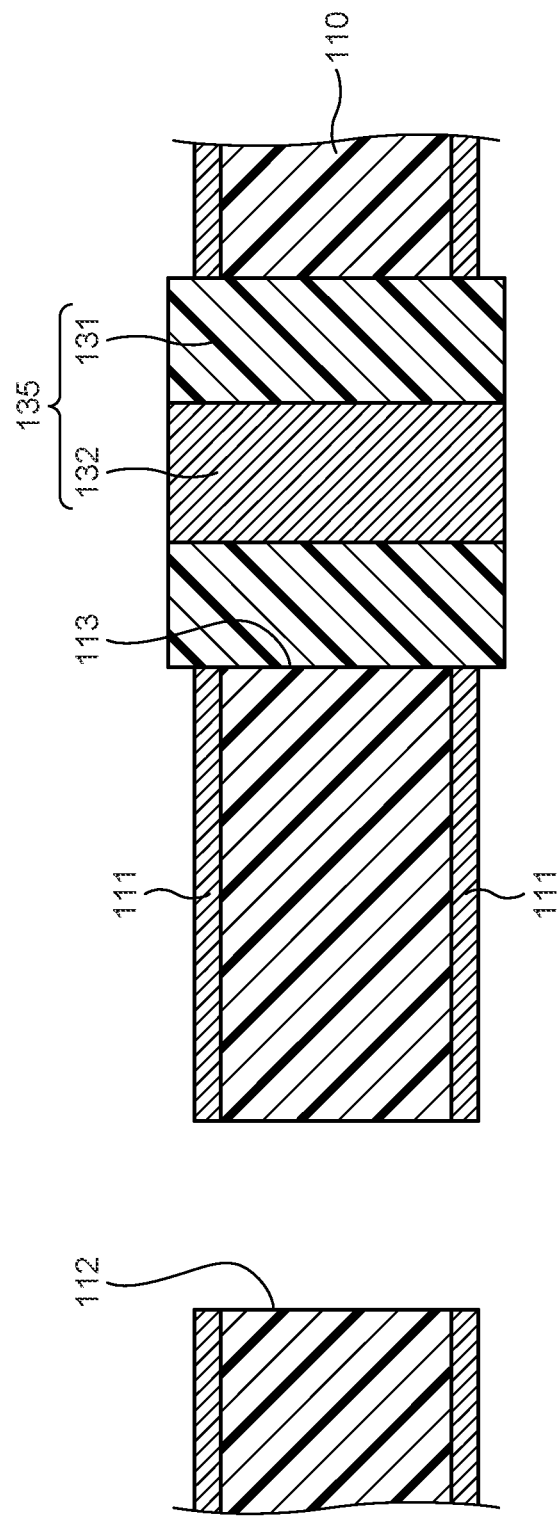
FIG. 8 is a diagram illustrating a specific example of a magnetic member embedding process.

Further, the magnetic member 135 is embedded in the through hole 113 (Step S102). Specifically, as illustrated in FIG. 8 for example, the magnetic member 135 including the magnetic body 131 and the conductor wire 132 is inserted in the through hole 113 that is formed in the base material 110, for example. At this time, the magnetic member 135 is embedded in the through hole 113 such that the conductor wire 132 that is arranged in the center of the magnetic member 135 is located at a central axis of the through hole 113. A diameter of the magnetic member 135 is approximately the same or slightly larger than the diameter of the through hole 113, so that it is possible to insert the magnetic member 135 in the through hole 113 without a gap due to elasticity of the magnetic body 131. Meanwhile, even if the magnetic member 135 has the configuration as illustrated in FIG. 3, it is possible to insert the magnetic member 135 in the through hole 113 without a gap due to elasticity of the insulating resin 203 that covers the strand wire.

Moreover, it may be possible to inject insulating resin, such as epoxy resin, along the inner wall surface of the through hole 113 such that the diameter of the through hole 113 conforms to the diameter of the magnetic member 135. With this operation, the filled insulating resin is located between the inner wall surface of the through hole 113 and the magnetic member 135, so that even if the magnetic body 131 that forms the magnetic member 135 does not have elasticity, it is possible to prevent a gap from being generated between the inner wall surface of the through hole 113 and the magnetic member 135.

When the magnetic member 135 is inserted in the through hole 113, both end portions of the magnetic member 135 protrude upward and downward from the metallic foils 111 on the base material 110 because the length of the magnetic member 135 is slightly larger than the thickness of the base material 110.

Therefore, the protruding portions are subjected to surface polishing such that the both end portions of the magnetic member 135 flush with the surfaces of the metallic foils 111 (Step S103). Specifically, as illustrated in FIG. 9 for example, the both ends of the magnetic member 135 are polished such that the surfaces of the metallic foils 111 flush with the both end faces of the magnetic member 135.

Figure 10:
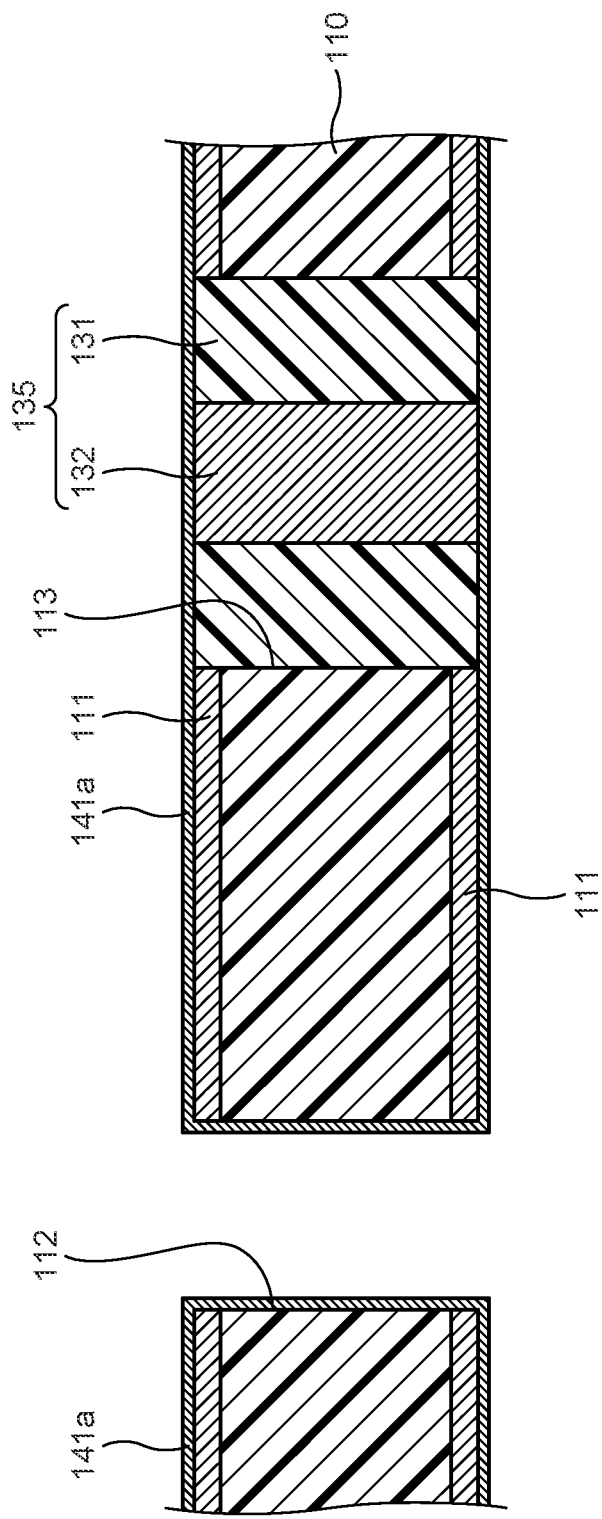
FIG. 10 is a diagram illustrating a specific example of a first electroless copper plating process.

After the surfaces of the metallic foils 111 flush with the both end faces of the magnetic member 135, the first electroless plating films 141a for covering portions that are exposed to the surfaces are formed (Step S104). Specifically, as illustrated in FIG. 10 for example, the surfaces of the metallic foils 111, the end faces of the magnetic member 135, and the inner wall surface of the through hole 112 are subjected to, for example, electroless copper plating, so that the first electroless plating films 141a are formed. A thickness of each of the first electroless plating films 141a is, for example, about 0.1 to 2.0 μm.

Figure 11:
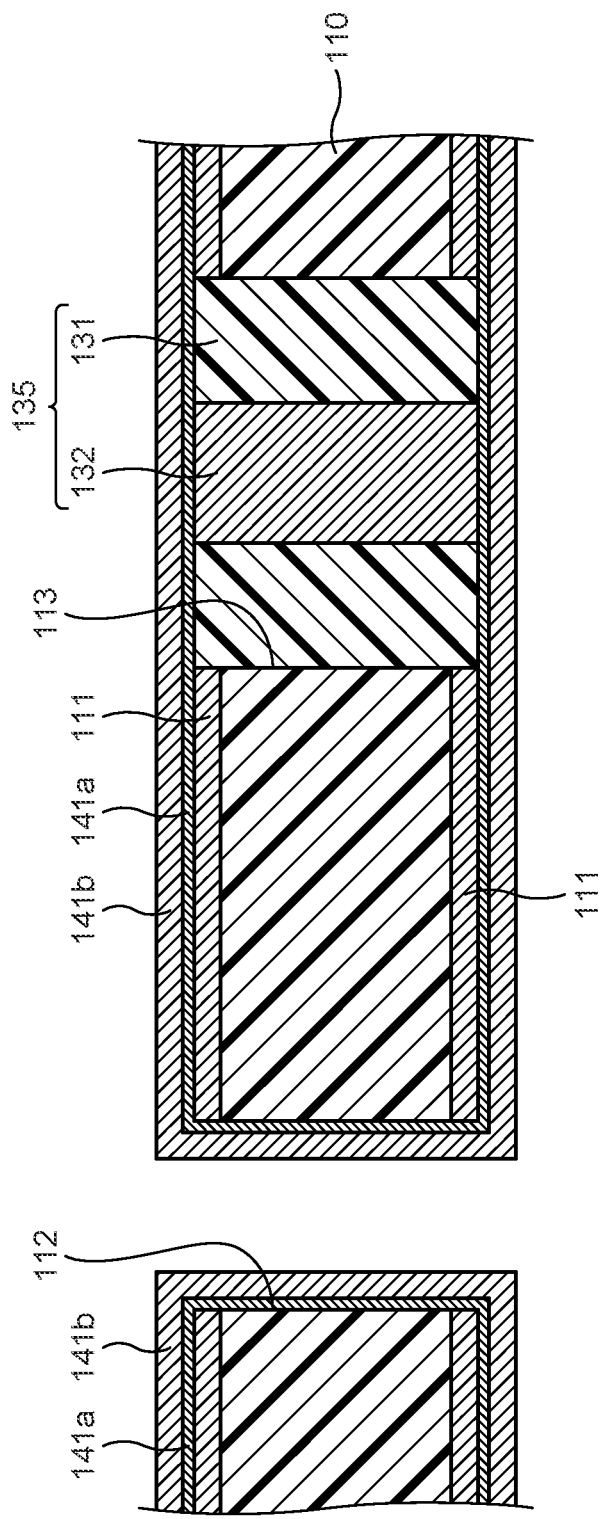
FIG. 11 is a diagram illustrating a specific example of a first electro copper plating process.

Furthermore, the first electroplating films 141b are laminated on the first electroless plating films 141a (Step S105). Specifically, as illustrated in FIG. 11 for example, the surfaces on which the first electroless plating films 141a are formed are subjected to, for example, electro copper plating, so that the first electroplating films 141b are formed. A thickness of each of the first electroplating films 141b is, for example, about 2 to 18 μm.

Figure 12:
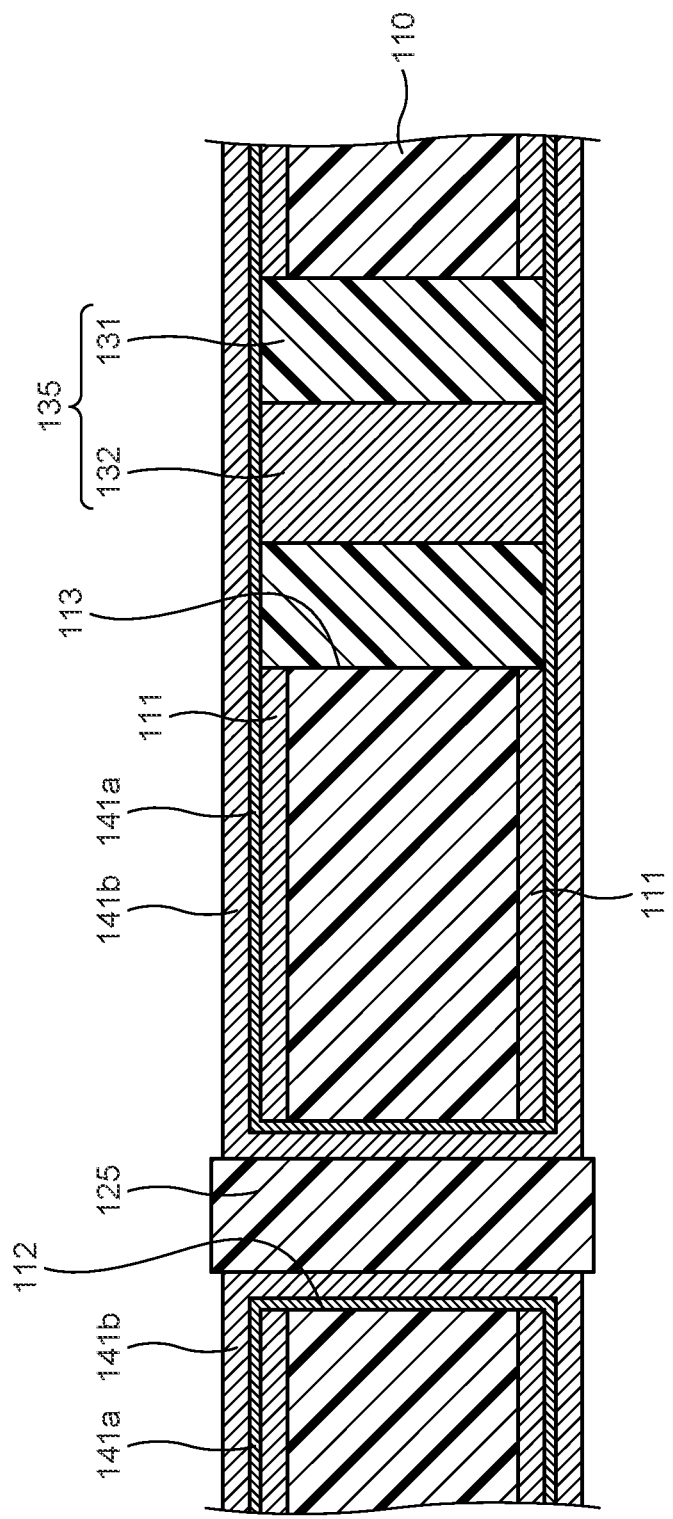
FIG. 12 is a diagram illustrating a specific example of an insulating resin filling process.

By forming the first electroless plating films 141a and the first electroplating films 141b, the through hole is formed on inner sides of the first electroplating films 141b in the through hole 112. The through hole is filled with the insulating resin 125 (Step S106). Specifically, as illustrated in FIG. 12 for example, the insulating resin 125 is filled on the inner sides of the first electroplating films 141b in the through hole 112. As the insulating resin 125, for example, epoxy resin containing filler, such as silica, may be used. The insulating resin 125 is filled on the inner sides of the first electroplating films 141b without a gap, and both end portions of the insulating resin 125 protrude upward and downward from the first electroless plating films 141a and the first electroplating films 141b laminated on the metallic foils 111.

Figure 13:
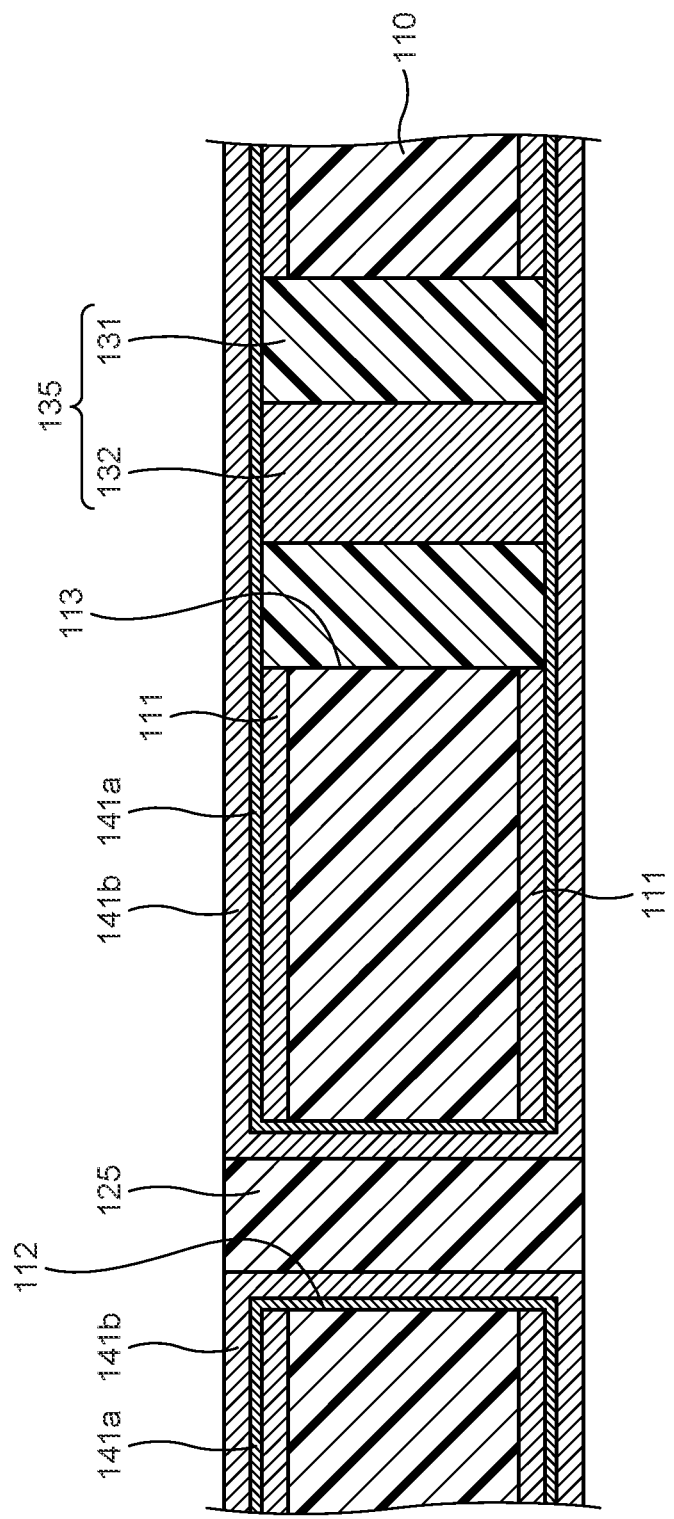
FIG. 13 is a diagram illustrating a specific example of a surface polishing process.

Therefore, the protruding portions are subjected to surface polishing such that the both end portions of the insulating resin 125 flush with the surfaces of the first electroplating films 141b (Step S107). Specifically, as illustrated in FIG. 13 for example, the both ends of the insulating resin 125 are polished such that an upper surface and a lower surface of the first electroplating films 141b flush with the both end faces of the insulating resin 125. Further, resinous residue that remains on the surfaces of the first electroplating films 141b due to polishing of the insulating resin 125 are removed by desmear processing. At this time, the both end faces of the magnetic member 135 are covered by the first electroless plating films 141a and the first electroplating film 141b, and therefore the magnetic body 131 is protected from a solution that is used in the desmear processing.

Figure 14:
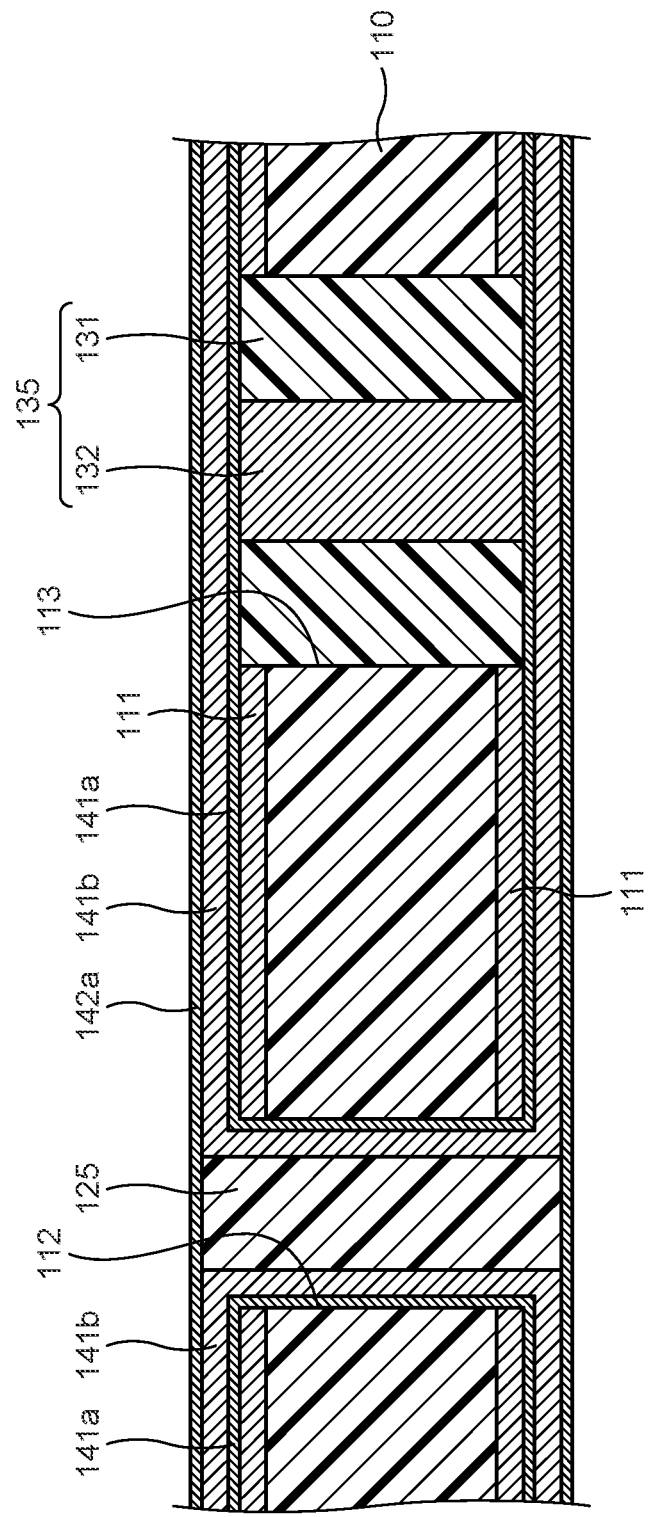
FIG. 14 is a diagram illustrating a specific example of a second electroless copper plating process.

After the upper surface and the lower surface of the first electroplating films 141b flush with the both end faces of the insulating resin 125, the second electroless plating films 142a for covering portions that are exposed to the surfaces are formed (Step S108). Specifically, as illustrated in FIG. 14 for example, the surfaces of the first electroplating films 141b and the end faces of the insulating resin 125 are subjected to, for example, electroless copper plating, so that the second electroless plating films 142a are formed. A thickness of each of the second electroless plating films 142a is, for example, about 0.1 to 2.0 μm, similarly to the first electroless plating films 141a.

Figure 15:
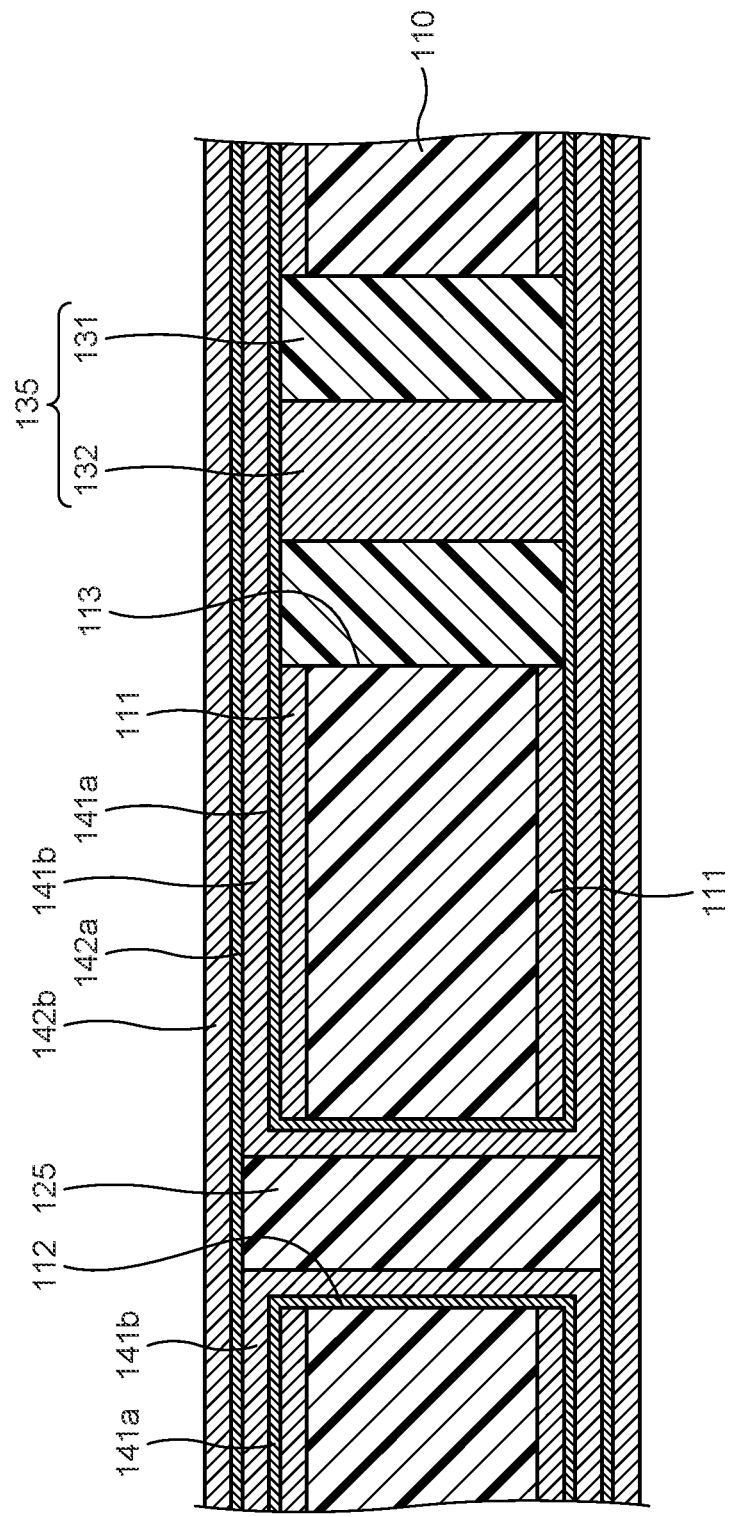
FIG. 15 is a diagram illustrating a specific example of a second electro copper plating process.

Furthermore, the second electroplating films 142b are laminated on the second electroless plating films 142a (Step S109). Specifically, as illustrated in FIG. 15 for example, the surfaces on which the second electroless plating films 142a are formed are subjected to, for example, electro copper plating, so that the second electroplating films 142b are laminated in a planar manner. A thickness of each of the second electroplating films 142b is, for example, 2 to 18 μm, similarly to the first electroplating films 141b.

Figure 16:
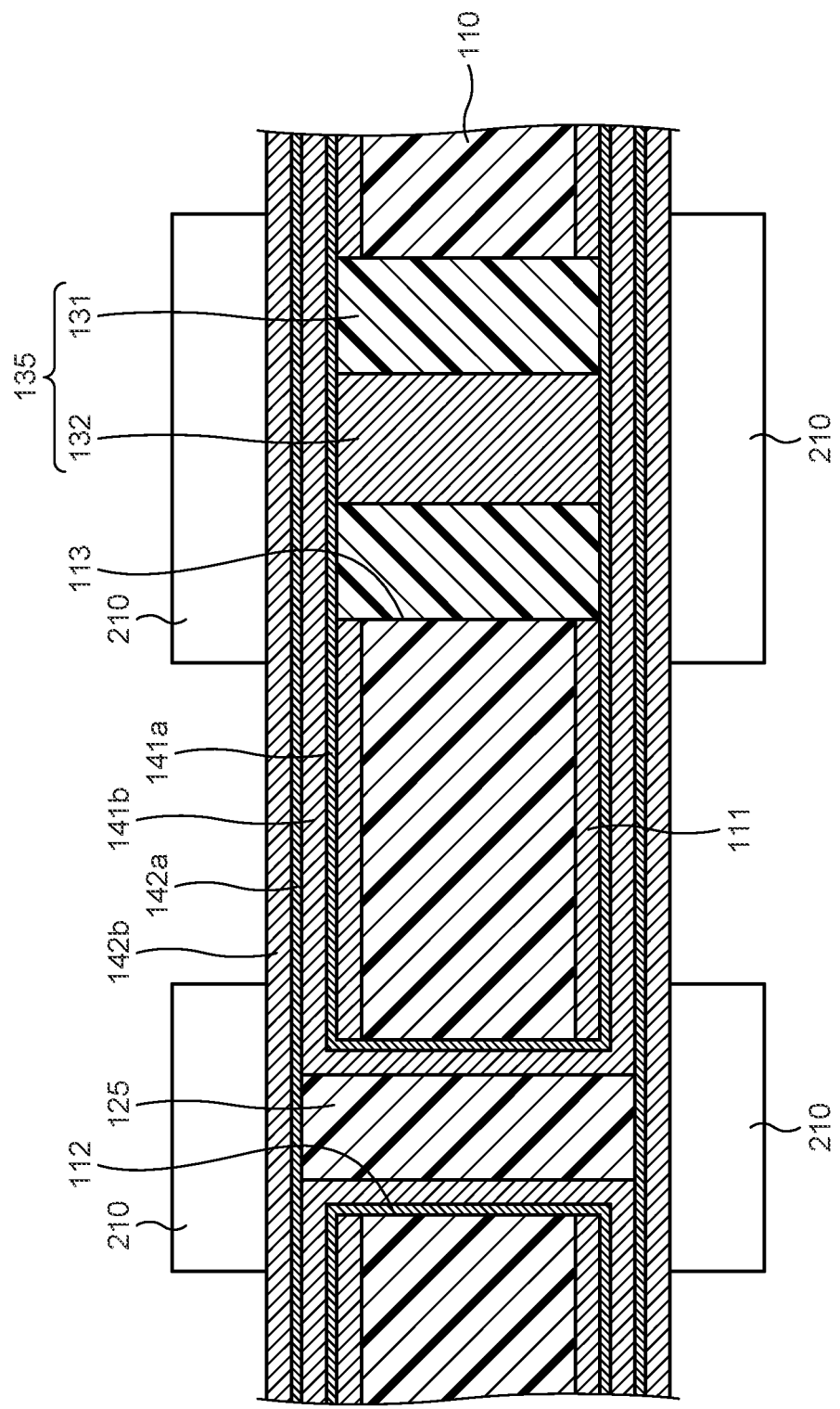
FIG. 16 is a diagram illustrating a specific example of an etching mask forming process.

Through the electroless plating and the electroplating as described above, all of the electroless plating films and the electroplating films are formed, and therefore, etching for forming the conductor layers 140a and the conductor layers 140b of the through hole portion 120 and the inductor portion 130 is performed (Step S110). Specifically, as illustrated in FIG. 16 for example, etching resists 210 are formed in portions in which the plating films are maintained as the conductor layers 140a and 140b. In FIG. 16, the etching resists 210 for forming the conductor layers 140a and 140b as pads at the positions of the insulating resin 125 and the magnetic member 135 are illustrated. The etching resists 210 are formed so as to cover wider areas than the through holes 112 and 113 on the surfaces of the second electroplating films 142b. The etching resists 210 are formed of a material that has desired resolution and etching resistance.

Figure 17:
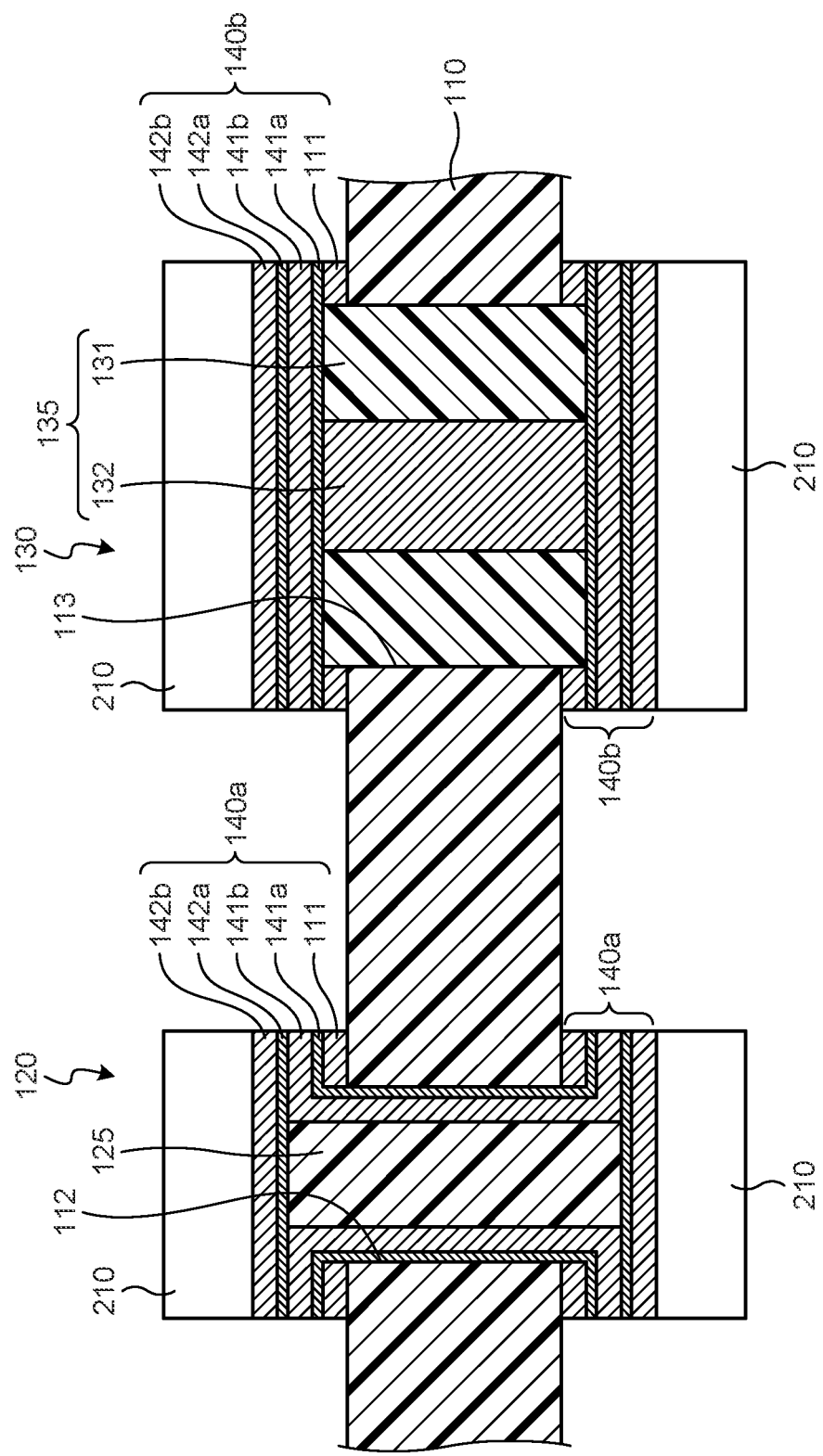
FIG. 17 is a diagram illustrating a specific example of an etching process.

Then, the metallic foils 111, the first electroless plating films 141a, the first electroplating films 141b, the second electroless plating films 142a, and the second electroplating films 142b are removed by wet etching by using the etching resists 210 as masks. Consequently, as illustrated in FIG. 17 for example, the through hole portion 120 that includes the conductor layers 140a as the pads and the inductor portion 130 that includes the conductor layers 140b as the pads are formed. By removing the etching resists 210 from the conductor layers 140a and 140b, the core substrate 100 is completed.

Figure 18:
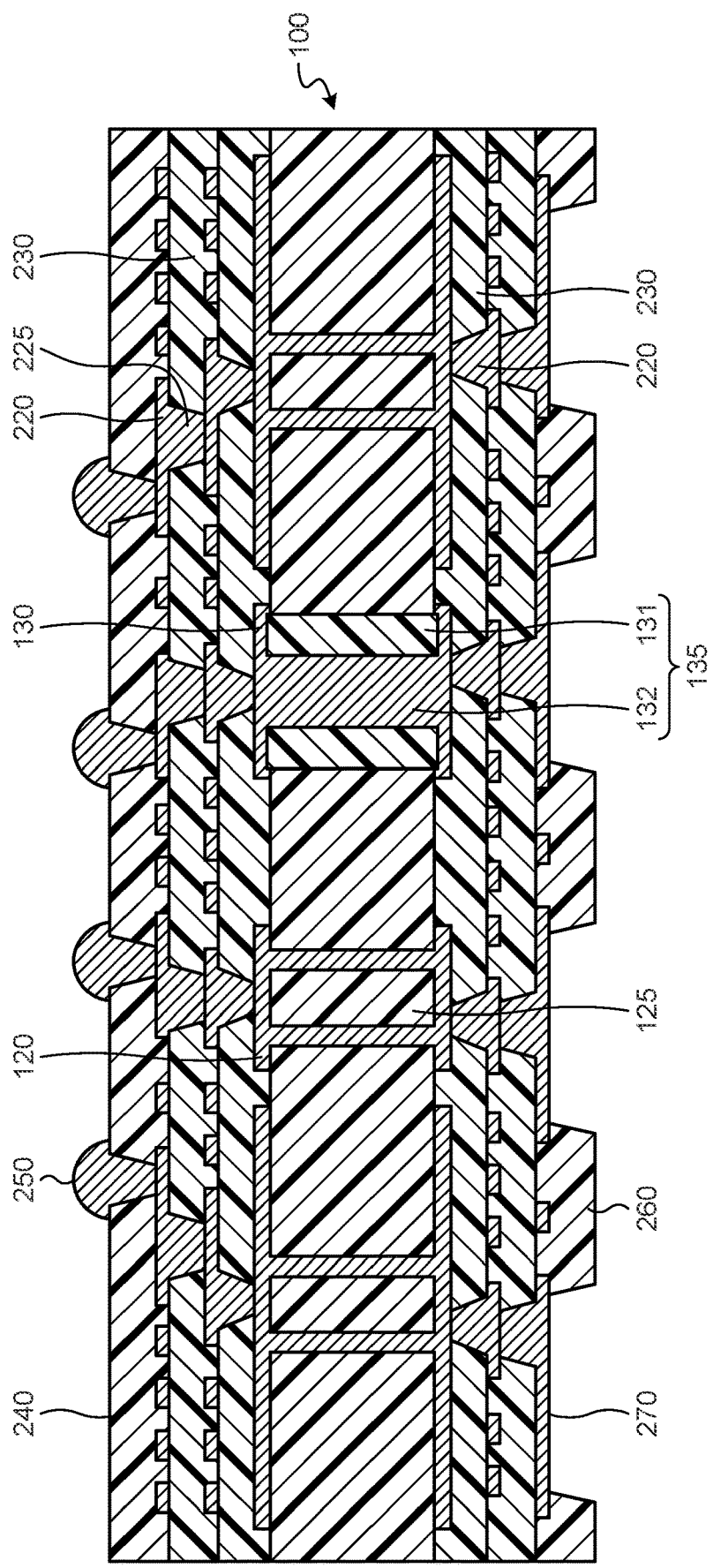
FIG. 18 is a diagram illustrating a configuration example of a wiring board.

Insulating layers and wiring layers are built up in this order on an upper surface and a lower surface of the core substrate 100, so that a multi-layer wiring board is formed (Step S111). Specifically, as illustrated in FIG. 18 for example, insulating layers 230 and wiring layers 220 are laminated on the upper surface and the lower surface of the core substrate 100, and the wiring layers 220 that are laminated in a vertical direction are electrically connected to each other by via wires 225 that are arranged in the insulating layers 230. Furthermore, the wiring layers 220 that are located closest to the core substrate 100 are electrically connected to the conductor layers 140a and 140b of the core substrate 100 by the via wires 225 that are arranged in the insulating layers 230.

Moreover, the topmost wiring layer 220 is covered by a solder resist layer 240. Through holes are formed in the solder resist layer 240, and connection terminals 250 that are formed of solder or the like for electrically connecting an electronic component, such as a semiconductor chip, and the wiring layer 220 are formed in the through holes, for example. In contrast, the lowermost wiring layer 220 is covered by a solder resist layer 260. Furthermore, opening portions are formed in the solder resist layer 260, and an external connection pad 270 that is formed on the lowermost wiring layer 220 is exposed from the opening portions. The external connection pad 270 is electrically connectable to an external component or device.

Figure 19:
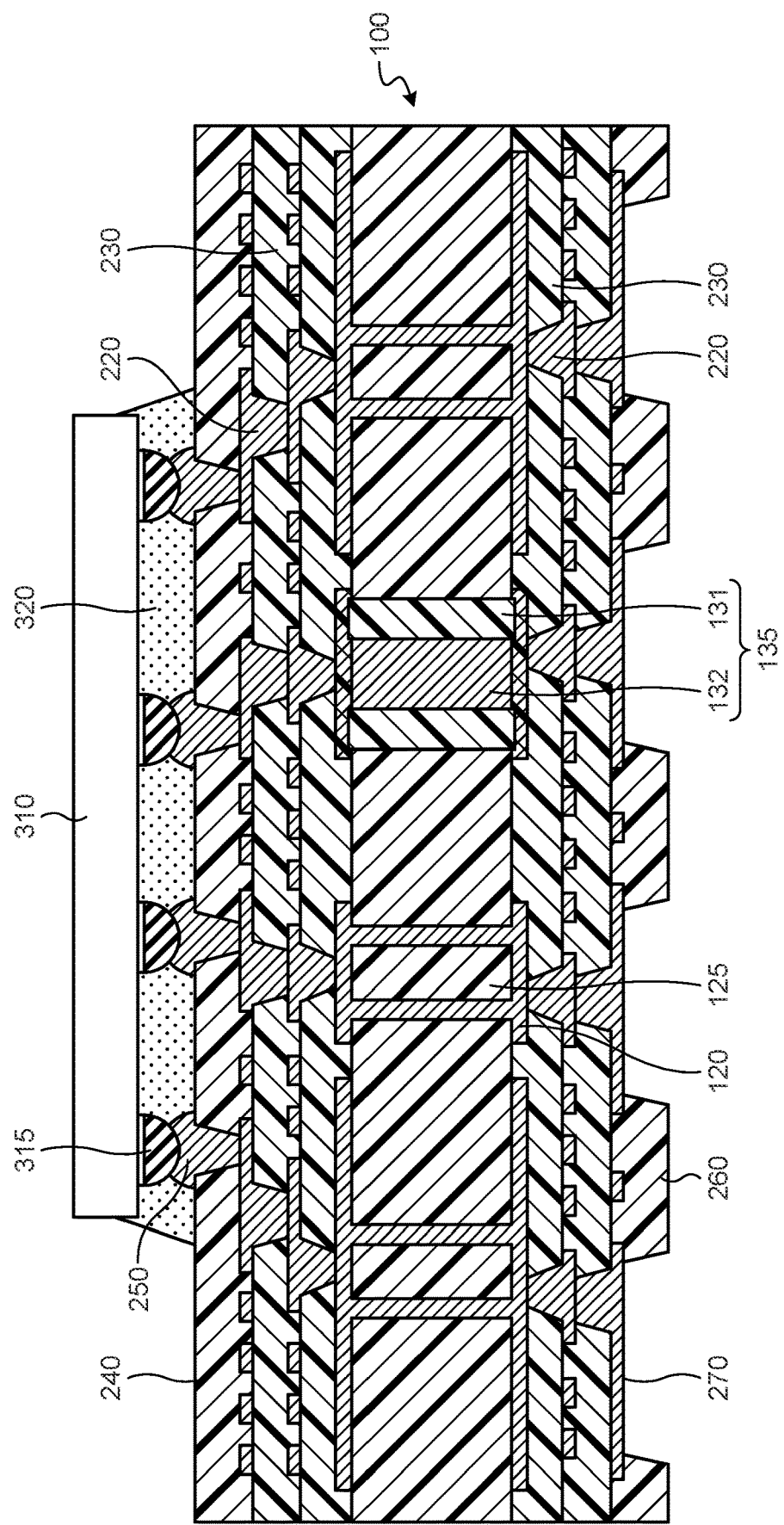
FIG. 19 is a diagram illustrating a configuration example of a semiconductor device.

In this manner, it is possible to form the multi-layer wiring board including the plurality of wiring layers 220 from the core substrate 100 in which the inductor portion 130 using the magnetic member 135 is built. The multi-layer wiring board may be used for, for example, a semiconductor device on which a component, such as a semiconductor chip, is mounted. Specifically, as illustrated in FIG. 19, a semiconductor chip 310 is mounted on an upper surface of the multi-layer wiring board. For example, the connection terminals 250 of the multi-layer wiring board and electrodes 315 that are formed of solder or the like in the semiconductor chip 310 are bonded together. Then, bonding portions between the connection terminals 250 and the electrodes 315 are sealed with underfill resin 320, so that a semiconductor device on which the semiconductor chip 310 is mounted is obtained.

As described above, according to the present embodiment, the magnetic member that is formed using the magnetic-body-covered conductor wire is embedded in the through hole of the base material, and the end faces of the magnetic member exposed from the opening portions of the through hole form an inductor that is covered by the electroless plating films and the electroplating films. Therefore, the conductor wire and the magnetic body are uniformly arranged in the inductor, so that it is possible to reduce variation of the inductance. Furthermore, it is possible to increase a volume of the conductor in the inductor, so that it is possible to reduce electrical resistance. In other words, it is possible to improve the electrical characteristics of the built-in inductor that is included in the core substrate.

Second Embodiment

In the first embodiment as described above, the magnetic member 135 is embedded in the through hole 113 of the base material 110, and thereafter the through hole 112 is filled with the insulating resin 125; however, it may be possible to fill the through hole 112 with the insulating resin 125 in advance, and thereafter embed the magnetic member 135 in the through hole 113. Therefore, in a second embodiment, a method of manufacturing a multi-layer wiring board in a case where the magnetic member 135 is embedded at a later time will be described.

Figure 20:
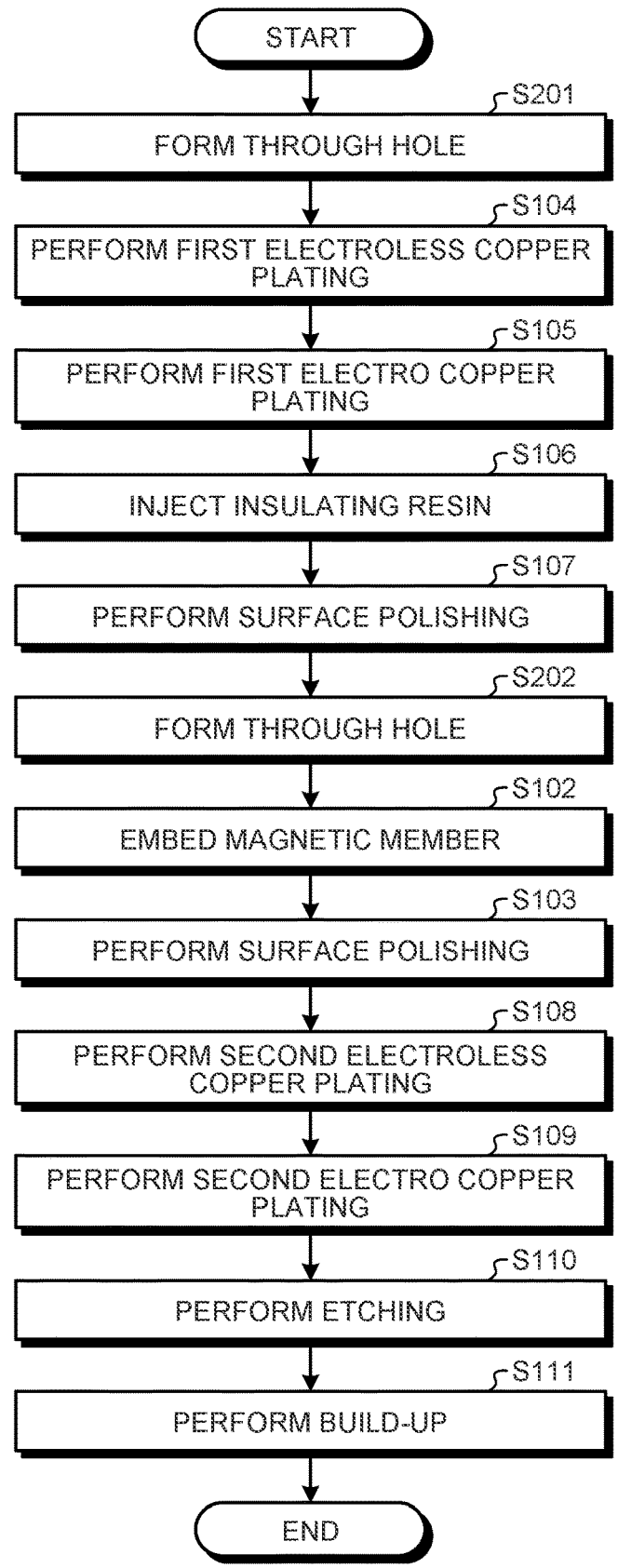
FIG. 20 is a flowchart illustrating a wiring board manufacturing method according to a second embodiment.

FIG. 20 is a flowchart illustrating a multi-layer wiring board manufacturing method according to the second embodiment. In FIG. 20, the same processes as those illustrated in FIG. 5 are denoted by the same reference symbols. In the multi-layer wiring board manufacturing method illustrated in FIG. 20, after the insulating resin 125 is filled at Step S106, the magnetic member 135 is embedded at Step S102.

First, the through hole 112 for forming the through hole portion 120 is formed in the base material 110 that includes an insulating plate member (Step S201). Specifically, the through hole 112 having the cylindrical shape in which the diameter of the opening portion is about 100 to 200 µm is formed in the base material 110 as illustrated in FIG. 21 for example. The through hole 112 is formed by, for example, laser processing or drilling, and after the through hole 112 is formed, desmear processing for removing resinous residue on the inner wall surface is performed. In the desmear processing, for example, a potassium permanganate solution may be used.

Figure 22:
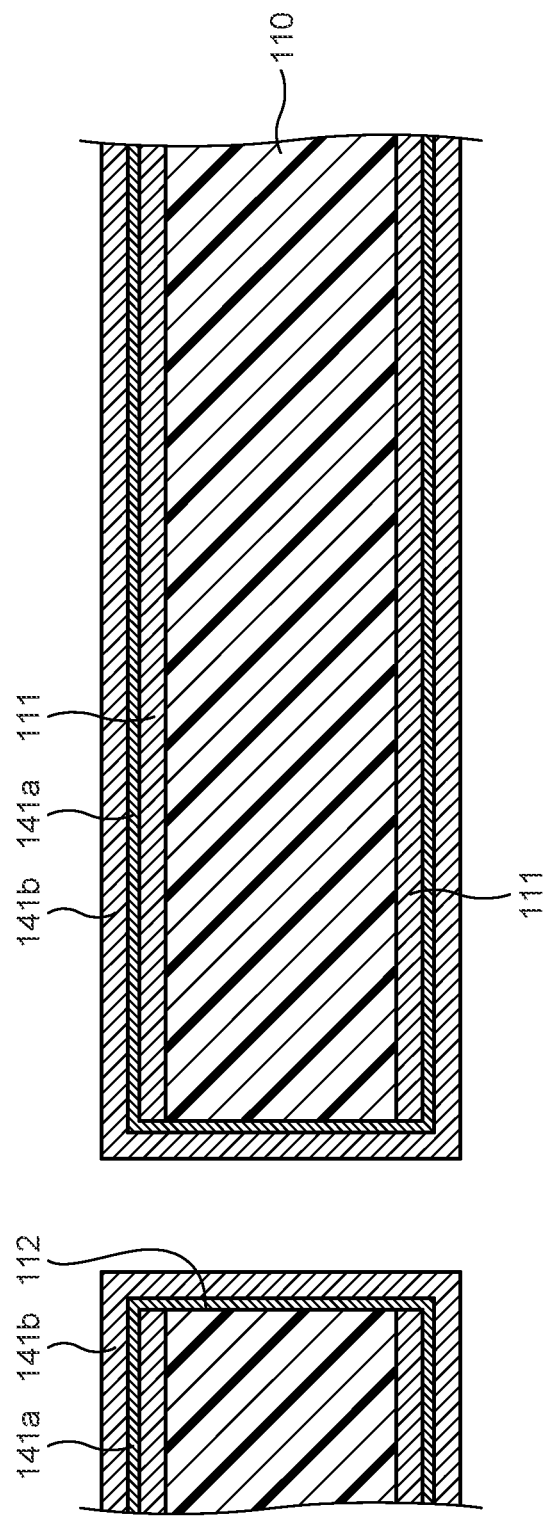
FIG. 22 is a diagram illustrating a specific example of a first electro copper plating process.

After the through hole 112 is formed, the first electroless plating films 141a for covering portions that are exposed to the surfaces are formed (Step S104), and subsequently, the first electroplating films 141b are laminated on the first electroless plating films 141a (Step S105). Specifically, as illustrated in FIG. 22 for example, the surfaces of the metallic foils 111 and the inner wall surface of the through hole 112 are subjected to, for example, electroless copper plating, so that the first electroless plating films 141a are formed. Further, the surfaces on which the first electroless plating films 141a are formed are subjected to, for example, electro copper plating, so that the first electroplating films 141b are formed. A thickness of each of the first electroless plating films 141a is, for example, about 0.1 to 2.0 µm. Furthermore, a thickness of each of the first electroplating films 141b is, for example, about 2 to 18 µm.

Figure 23:
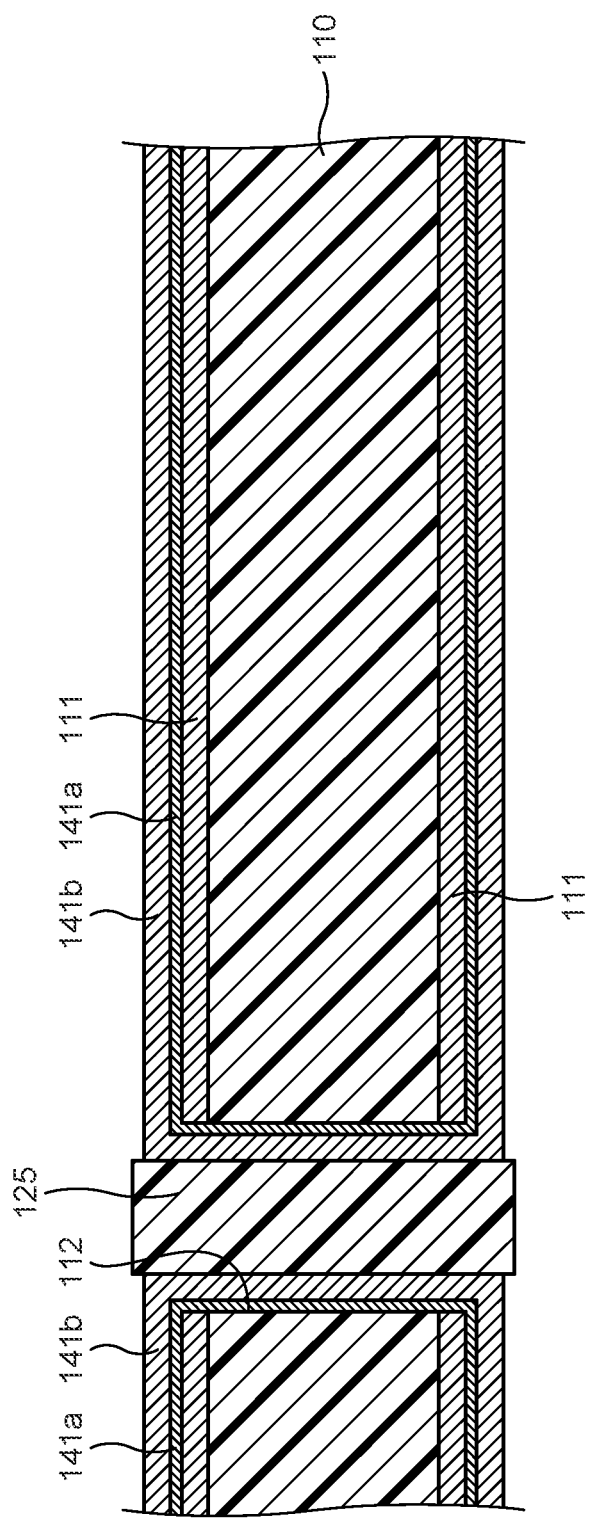
FIG. 23 is a diagram illustrating a specific example of an insulating resin filling process.

By forming the first electroless plating films 141a and the first electroplating films 141b, the through hole is formed on the inner sides of the first electroplating films 141b in the through hole 112. The through hole is filled with the insulating resin 125 (Step S106). Specifically, as illustrated in FIG. 23 for example, the insulating resin 125 is filled on the inner sides of the first electroplating films 141b in the through hole 112. As the insulating resin 125, for example, epoxy resin containing filler, such as silica, may be used. The insulating resin 125 is filled on the inner sides of the first electroplating films 141b without a gap, and the both end portions of the insulating resin 125 protrude upward and downward from the first electroless plating films 141a and the first electroplating films 141b laminated on the metallic foils 111.

Figure 24:
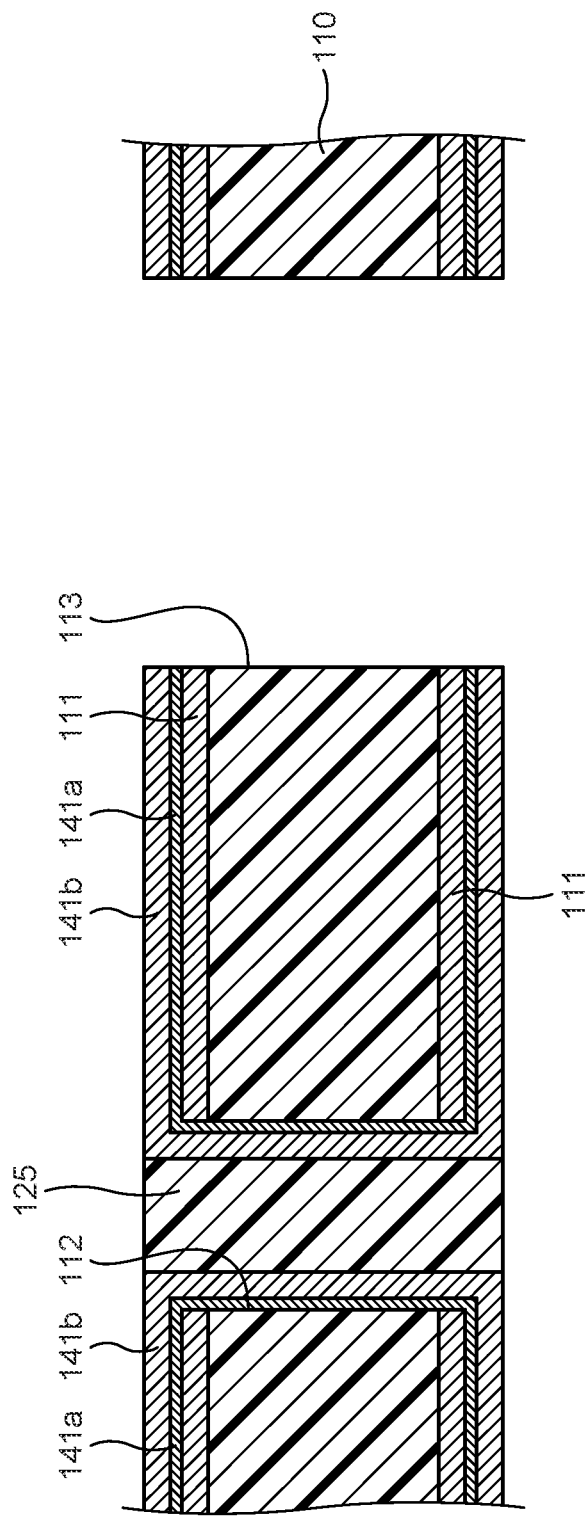
FIG. 24 is a diagram illustrating a specific example of a through hole forming process.

The protruding both end portions of the insulating resin 125 are subjected to surface polishing (Step S107), and if the upper surface and the lower surface of the first electroplating films 141b flush with the both end faces of the insulating resin 125, the through hole 113 for forming the inductor portion 130 is formed (Step S202). Specifically, the through hole 113 having the cylindrical shape in which the diameter of the opening portion is about 250 to 550 µm is formed in the base material 110 on which the first electroless plating films 141a and the first electroplating films 141b are formed as illustrated in FIG. 24, for example. The through hole 113 is formed by, for example, laser processing or drilling, and after the through hole 113 is formed, desmear processing for removing resinous residue on the inner wall surface is performed.

Figure 25:
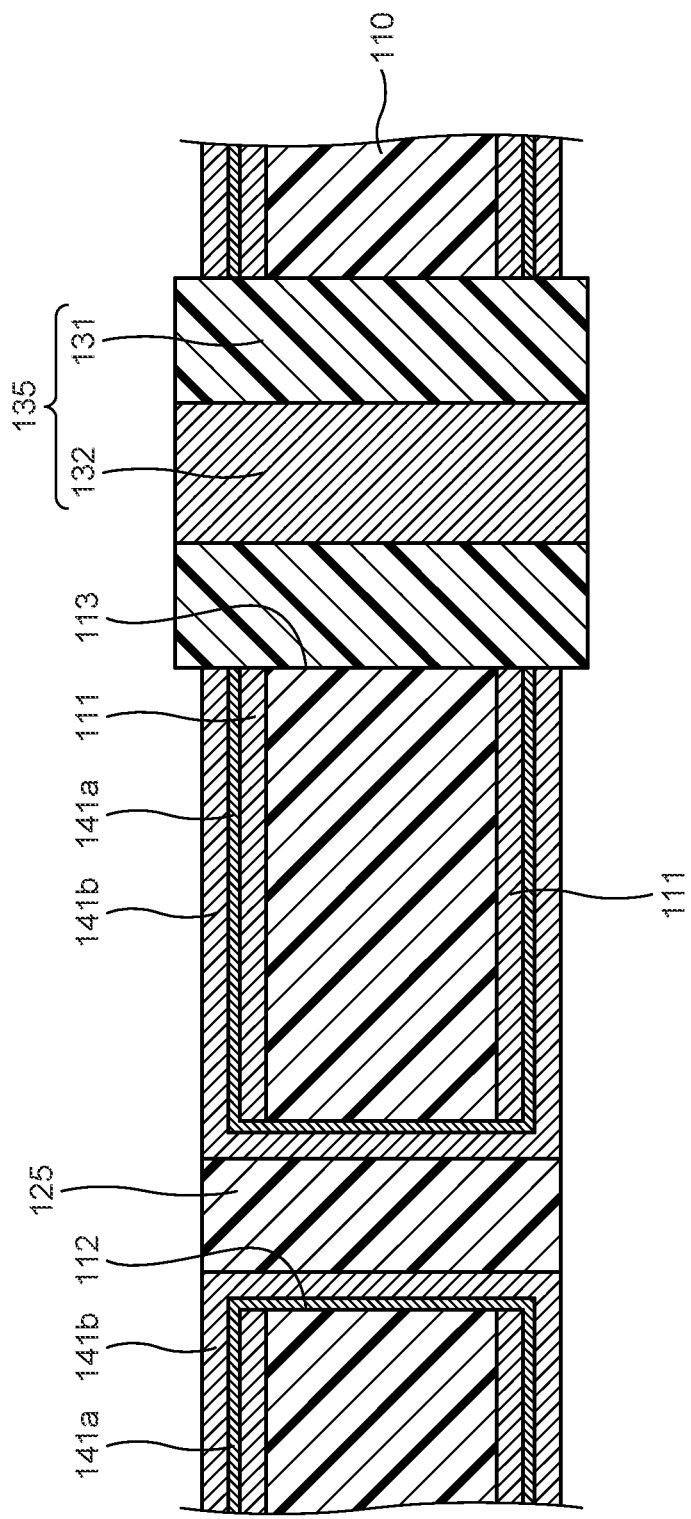
FIG. 25 is a diagram illustrating a specific example of a magnetic member embedding process.

Further, the magnetic member 135 is embedded in the through hole 113 (Step S102). Specifically, as illustrated in FIG. 25 for example, the magnetic member 135 including the magnetic body 131 and the conductor wire 132 is inserted in the through hole 113, for example. The diameter of the magnetic member 135 is approximately the same or slightly larger than the diameter of the through hole 113, so that it is possible to insert the magnetic member 135 in the through hole 113 without a gap due to the elasticity of the magnetic body 131. Furthermore, the length of the magnetic member 135 is slightly larger than the thickness of the base material 110, so that the both end portions of the magnetic member 135 protrude upward and downward from the first electroless plating films 141a and the first electroplating films 141b laminated on the metallic foils 111.

Figure 26:
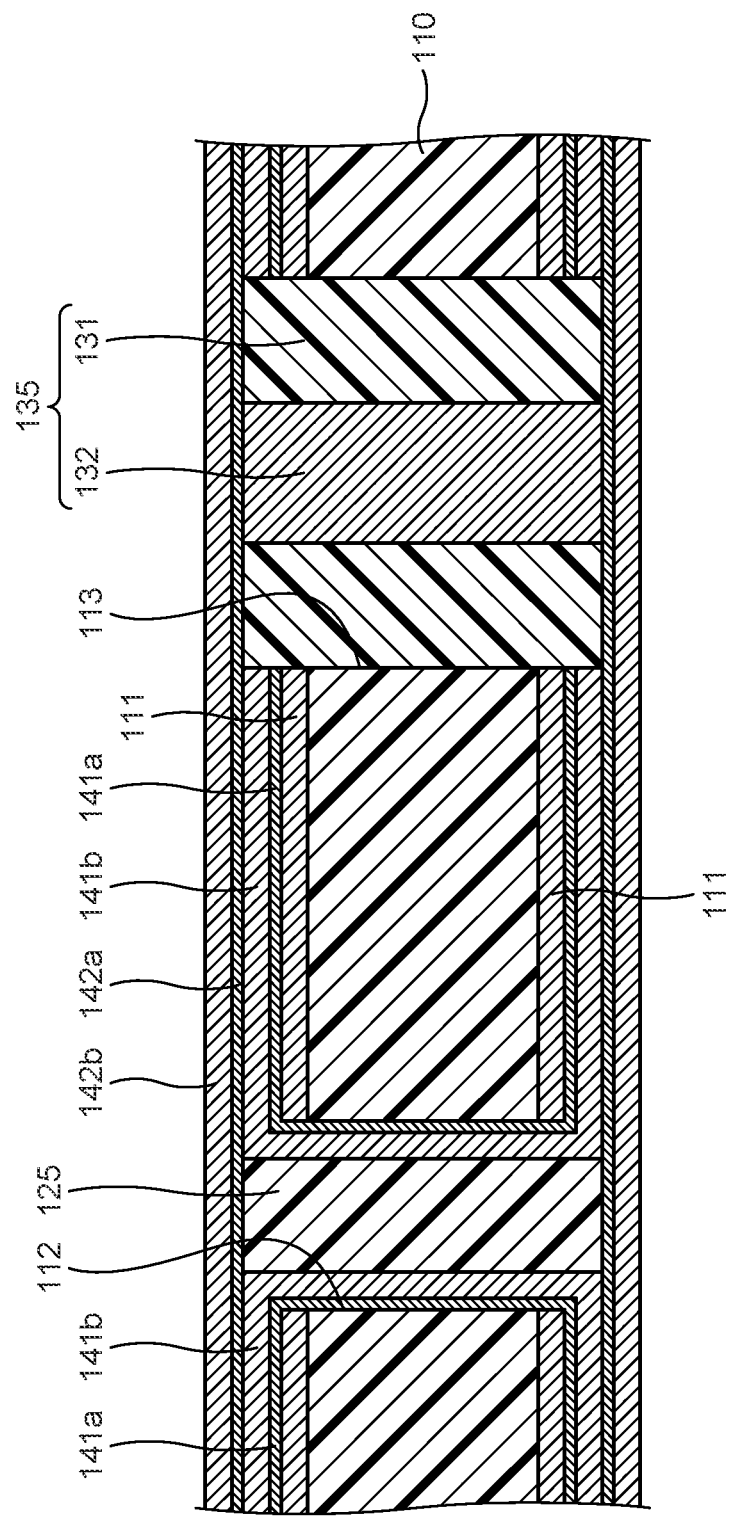
FIG. 26 is a diagram illustrating a specific example of a second electro copper plating process.

The protruding both end portions of the magnetic member 135 are subjected to surface polishing (Step S103), and if the upper surface and the lower surface of the first electroplating films 141b flush with the both end faces of the magnetic member 135, the second electroless plating films 142a and the second electroplating films 142b are formed on portions that are exposed to the surfaces (Steps S108 and S109). Specifically, as illustrated in FIG. 26 for example, the surfaces of the first electroplating films 141b, the end faces of the insulating resin 125, and the end faces of the magnetic member 135 are subjected to, for example, electroless copper plating, so that the second electroless plating films 142a are formed. Further, the surfaces on which the second electroless plating films 142a are formed are subjected to, for example, electro copper plating, so that the second electroplating films 142b are laminated in a planar manner. A thickness of each of the second electroless plating films 142a is, for example, about 0.1 to 2.0 µm. Furthermore, a thickness of each of the second electroplating films 142b is, for example, about 2 to 18 µm.

Figure 27:
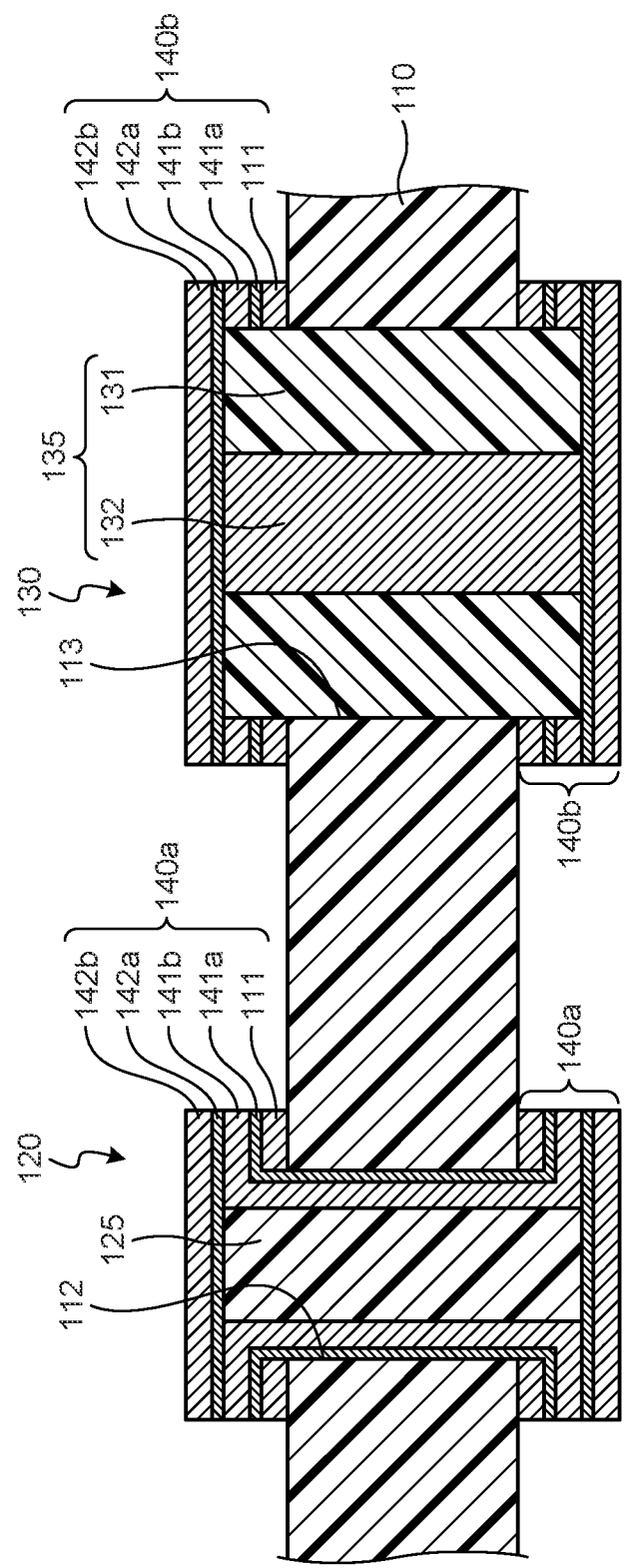
FIG. 27 is a diagram illustrating a specific example of an etching process.

Through the electroless plating and the electroplating as described above, all of the electroless plating films and the electroplating films are formed, and therefore, etching for forming the conductor layers 140a and the conductor layers 140b of the through hole portion 120 and the inductor portion 130 is performed (Step S110). Specifically, etching resists are formed in portions in which the plating films are maintained as the conductor layers 140a and 140b, and the metallic foils 111, the first electroless plating films 141a, the first electroplating films 141b, the second electroless plating films 142a, and the second electroplating films 142b are removed by wet etching. Consequently, as illustrated in FIG. 27 for example, the through hole portion 120 that includes the conductor layers 140a as the pads and the inductor portion 130 that includes the conductor layers 140b as the pads are formed.

Insulating layers and wiring layers are built up in this order on the upper surface and the lower surface of the core substrate 100, so that a multi-layer wiring board is formed (Step S111). Further, it may be possible to mount a semiconductor chip on the multi-layer wiring board to form a semiconductor device. The core substrate 100 according to the present embodiment is different from the core substrate 100 according to the first embodiment in that the both end faces of the magnetic member 135 are covered by the second electroless plating films 142a. Specifically, in the core substrate 100 according to the first embodiment, the magnetic member 135 is embedded and formed in advance of filling of the insulating resin 125, so that the both end faces of the magnetic member 135 are covered by the first electroless plating films 141a. In contrast, in the core substrate 100 according to the present embodiment, the magnetic member 135 is embedded and formed after filling of the insulating resin 125, so that the both end faces of the magnetic member 135 are covered by the second electroless plating films 142a. Other configurations of the core substrate 100 are the same between the first embodiment and the second embodiment, and the configuration of the multi-layer wiring board and the semiconductor device that are formed using the core substrate 100 are the same between the first embodiment and the second embodiment.

As described above, according to the present embodiment, after the through hole is filled with the insulating resin, the magnetic member that is formed by using the magnetic-body-covered conductor wire is embedded in the through hole of the base material, so that the inductor is formed. Therefore, even when the core substrate is formed by forming the through hole that is filled with the insulating resin and thereafter forming the inductor using the magnetic member, it is possible to improve the electrical characteristics of the built-in inductor that is included in the core substrate.

Third Embodiment

In the first and the second embodiments as described above, the through hole 112 is already formed when the magnetic member 135 is embedded in the through hole 113 of the base material 110; however, it may be possible to form the through hole 112 after embedding the magnetic member 135 in the through hole 113. Therefore, in a third embodiment, a multi-layer wiring board manufacturing method in a case where the through hole 112 is formed at a later time will be described.

Figure 28:
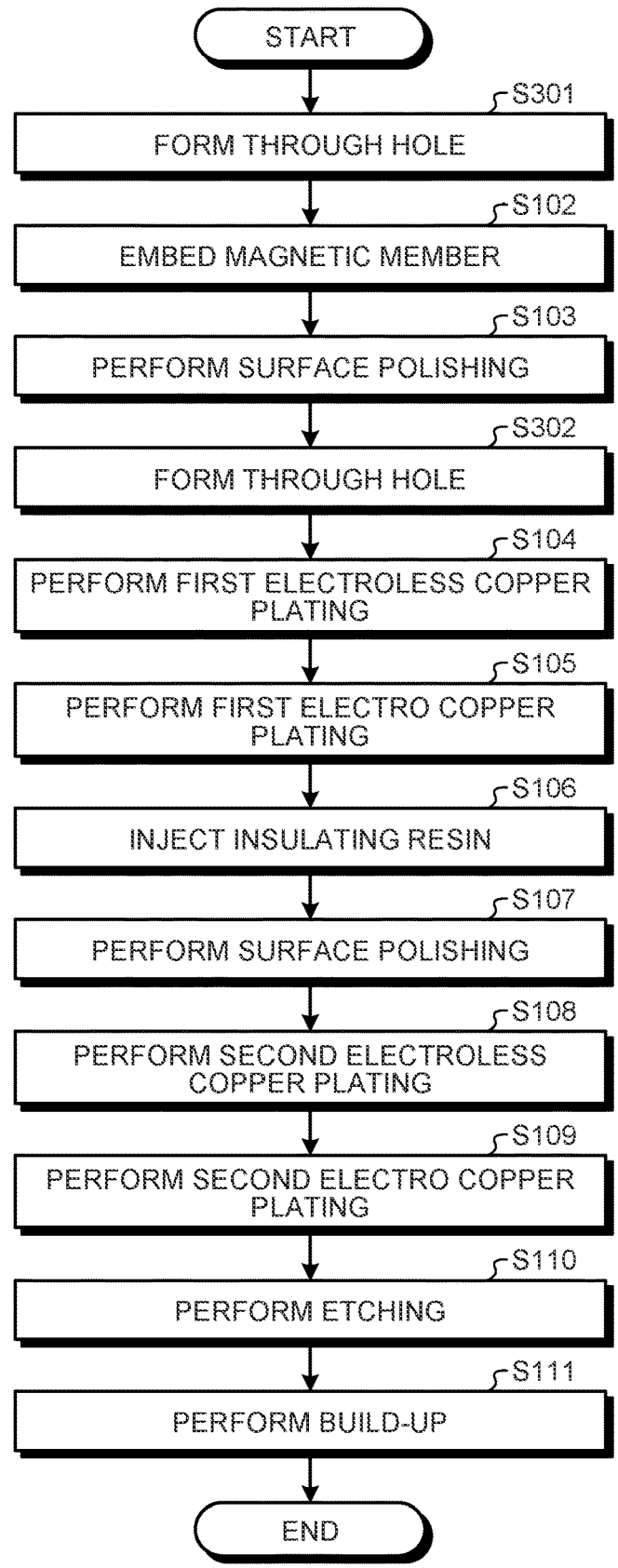
FIG. 28 is a flowchart illustrating a wiring board manufacturing method according to a third embodiment.

FIG. 28 is a flowchart illustrating a multi-layer wiring board manufacturing method according to the third embodiment. In FIG. 28, the same processes as those illustrated in FIG. 5 are denoted by the same reference symbols. In the multi-layer wiring board manufacturing method illustrated in FIG. 28, after surface polishing is performed on the magnetic member 135 at Step S103, the through hole 112 to be filled with the insulating resin 125 is formed.

Figure 29:
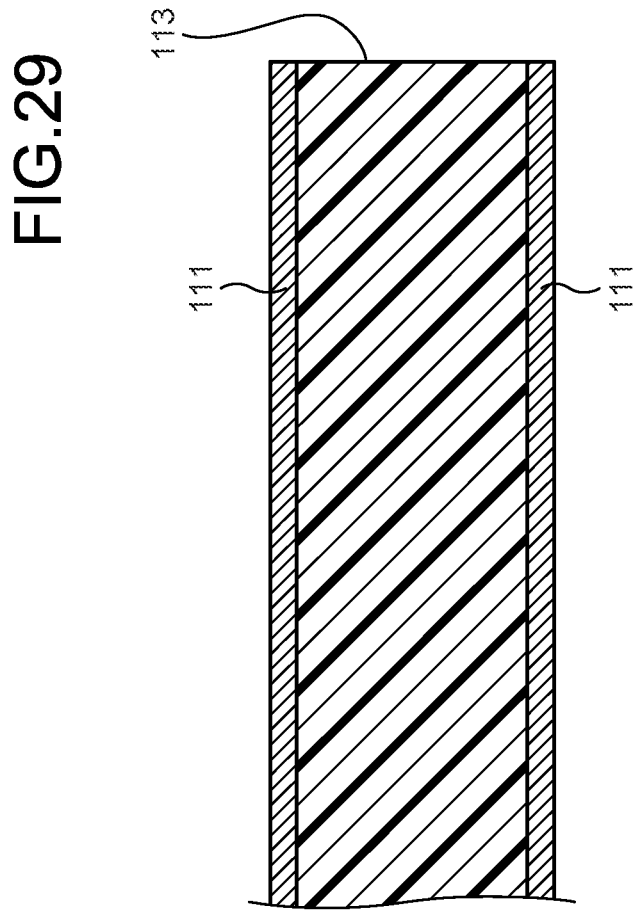
FIG. 29 is a diagram illustrating a specific example of a through hole forming process.

First, the through hole 113 for forming the inductor portion 130 is formed in the base material 110 that includes an insulating plate member (Step S301). Specifically, the through hole 113 having the cylindrical shape in which the diameter of the opening portion is about 250 to 550 μm is formed in the base material 110 as illustrated in FIG. 29 for example. The through hole 113 is formed by, for example, laser processing or drilling, and after the through hole 113 is formed, desmear processing for removing resinous residue on the inner wall surface is performed. In the desmear processing, for example, a potassium permanganate solution may be used.

Figure 30:
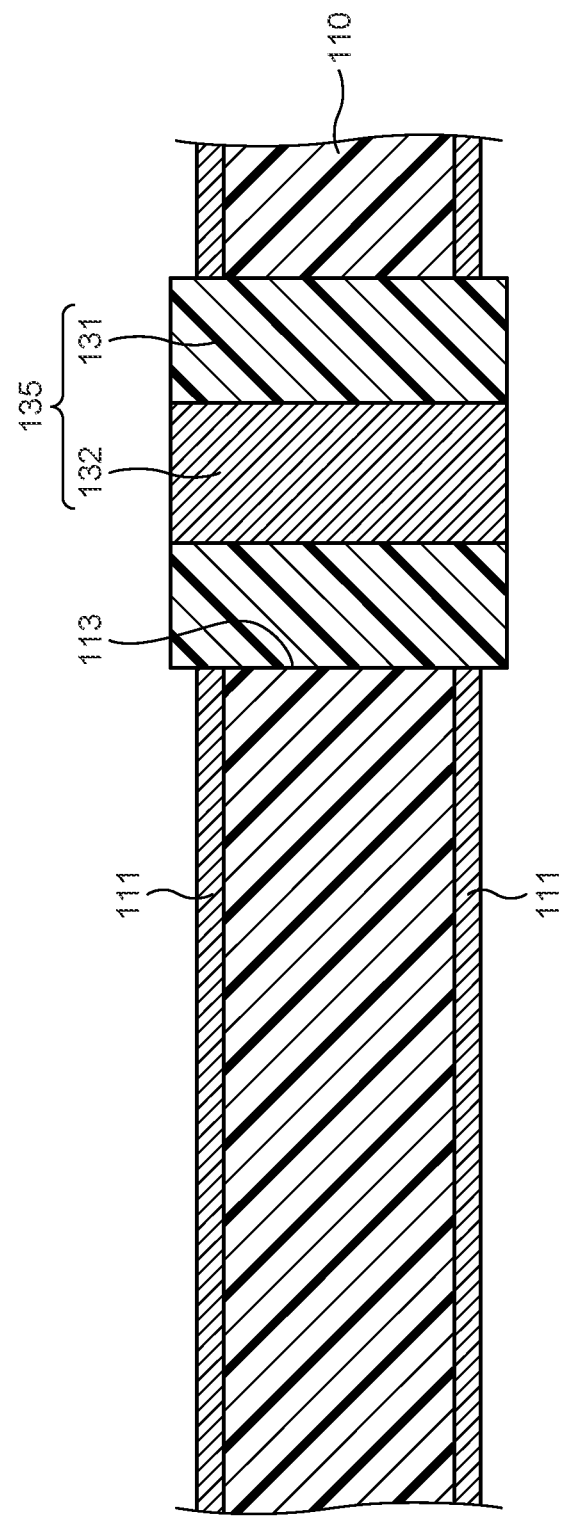
FIG. 30 is a diagram illustrating a specific example of a magnetic member embedding process.

Then, the magnetic member 135 is embedded in the through hole 113 (Step S102). Specifically, as illustrated in FIG. 30 for example, the magnetic member 135 including the magnetic body 131 and the conductor wire 132 is inserted in the through hole 113, for example. The diameter of the magnetic member 135 is approximately the same or slightly larger than the diameter of the through hole 113, so that it is possible to insert the magnetic member 135 in the through hole 113 without a gap due to the elasticity of the magnetic body 131. Furthermore, the length of the magnetic member 135 is slightly larger than the thickness of the base material 110, so that the both end portions of the magnetic member 135 protrude upward and downward from the metallic foils 111 of the base material 110.

Figure 31:
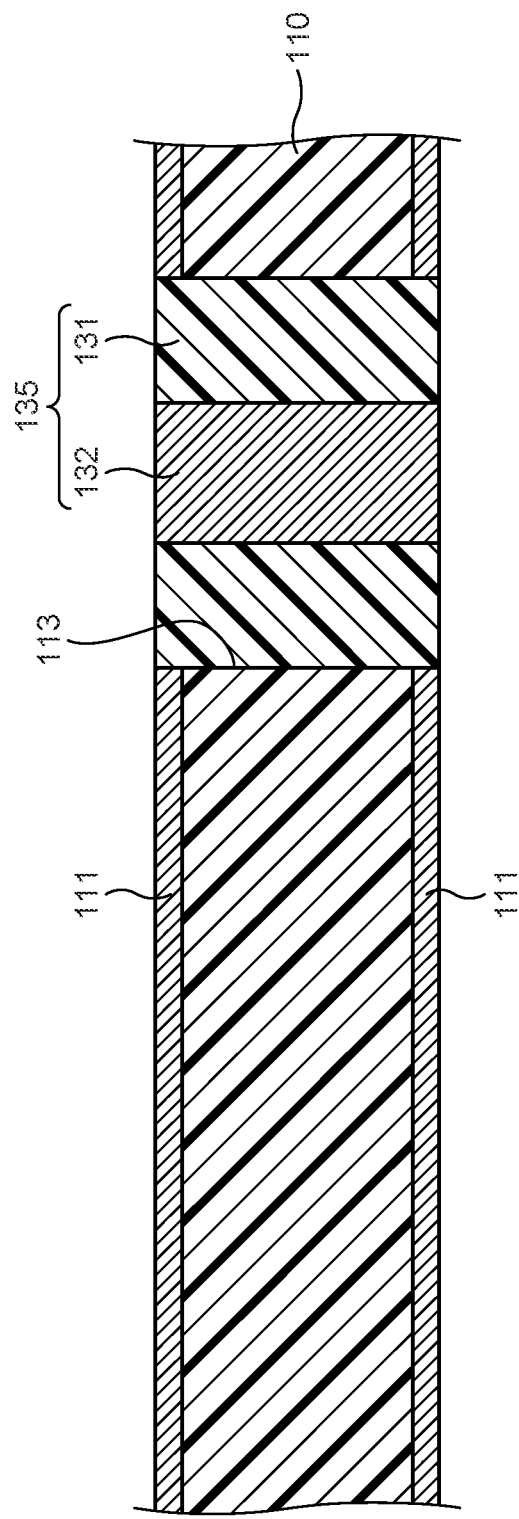
FIG. 31 is a diagram illustrating a specific example of a surface polishing process.

Therefore, the protruding portions are subjected to surface polishing such that the both end portions of the magnetic member 135 flush with the surfaces of the metallic foils 111 (Step S103). Specifically, as illustrated in FIG. 31 for example, the both ends of the magnetic member 135 are polished such that the surfaces of the metallic foils 111 flush with the both end faces of the magnetic member 135. In the present embodiment, when the both ends of the magnetic member 135 are polished, the through hole 112 for forming the through hole portion 120 is not yet formed. Therefore, residue or the like that is generated due to polishing of the magnetic member 135 does not enter and remain in the through hole 112.

After the surfaces of the metallic foils 111 flush with the both end faces of the magnetic member 135, the through hole 112 for forming the through hole portion 120 is formed (Step S302). Specifically, the through hole 112 having the cylindrical shape in which the diameter of the opening portion is about 100 to 200 μm is formed in the base material 110 as illustrated in FIG. 32, for example. The through hole 112 is formed by, for example, laser processing or drilling, and after the through hole 112 is formed, desmear processing for removing resinous residue on the inner wall surface is performed. At this time, the magnetic body 131 included in the magnetic member 135 may be made of magnetic metal in order to reduce an influence of a solution that it used to desmear on the both end faces of the magnetic member 135 that are exposed to the surface.

After the through hole 112 is formed, the first electroless plating films 141a for covering portions that are exposed to the surfaces (Step S104), and thereafter the first electroplating films 141b are laminated on the first electroless plating films 141a (Step S105). In other words, similarly to the first embodiment, the surfaces of the metallic foils 111, the end faces of the magnetic member 135, and the inner wall surface of the through hole 112 are subjected to, for example, electroless copper plating and electro copper plating, so that the first electroless plating films 141a and the first electroplating films 141b are formed.

With formation of the first electroless plating films 141a and the first electroplating films 141b, the through hole is formed on the inner sides of the first electroplating films 141b in the through hole 112. The through hole is filled with the insulating resin 125 (Step S106). As the insulating resin 125, for example, epoxy resin containing filler, such as silica, may be used. The insulating resin 125 is filled on the inner sides of the first electroplating films 141b without a gap, and the both end portions of the insulating resin 125 protrude upward and downward from the first electroless plating films 141a and the first electroplating films 141b laminated on the metallic foils 111.

The both end portions of the insulating resin 125 are subjected to surface polishing (Step S107), and if the upper surface and the lower surface of the first electroplating films 141b flush with the both end faces of the insulating resin 125, the second electroless plating films 142a and the second electroplating films 142b are formed in portions that are exposed to the surfaces (Steps S108 and S109). Specifically, similarly to the first embodiment, the surfaces of the first electroplating films 141b and the end faces of the insulating resin 125 are subjected to, for example, electroless copper plating and electro copper plating, so that the second electroless plating films 142a and the second electroplating films 142b are formed.

Through the electroless plating and the electroplating as described above, all of the electroless plating films and the electroplating films are formed, and etching for forming the conductor layers 140a and the conductor layers 140b of the through hole portion 120 and the inductor portion 130 is performed (Step S110). Specifically, etching resists are formed in portions in which the plating films are maintained as the conductor layers 140a and 140b, and the metallic foils 111, the first electroless plating films 141a, the first electroplating films 141b, the second electroless plating films 142a, and the second electroplating films 142b are removed by wet etching. With this configuration, similarly to the first embodiment (FIG. 17), the through hole portion 120 including the conductor layers 140a as the pads and the inductor portion 130 including the conductor layers 140b as the pad are formed.

Insulating layers and wiring layers are built up in this order on the upper surface and the lower surface of the core substrate 100 that is formed as described above, the, so that a multi-layer wiring board is formed (Step S111). Furthermore, it may be possible to mount a semiconductor chip on the multi-layer wiring board to form a semiconductor device.

As described above, according to the present embodiment, the magnetic member that is formed by using the magnetic-body-covered conductor wire is embedded in the through hole of the base material, and thereafter the through hole is formed by forming the through hole in the base material. Therefore, it is possible to prevent residue that is generated when the magnetic member is polished from entering and remaining in the through hole, and it is possible to improve the electrical characteristics of the built-in inductor that is included in the core substrate.

Figure 33:
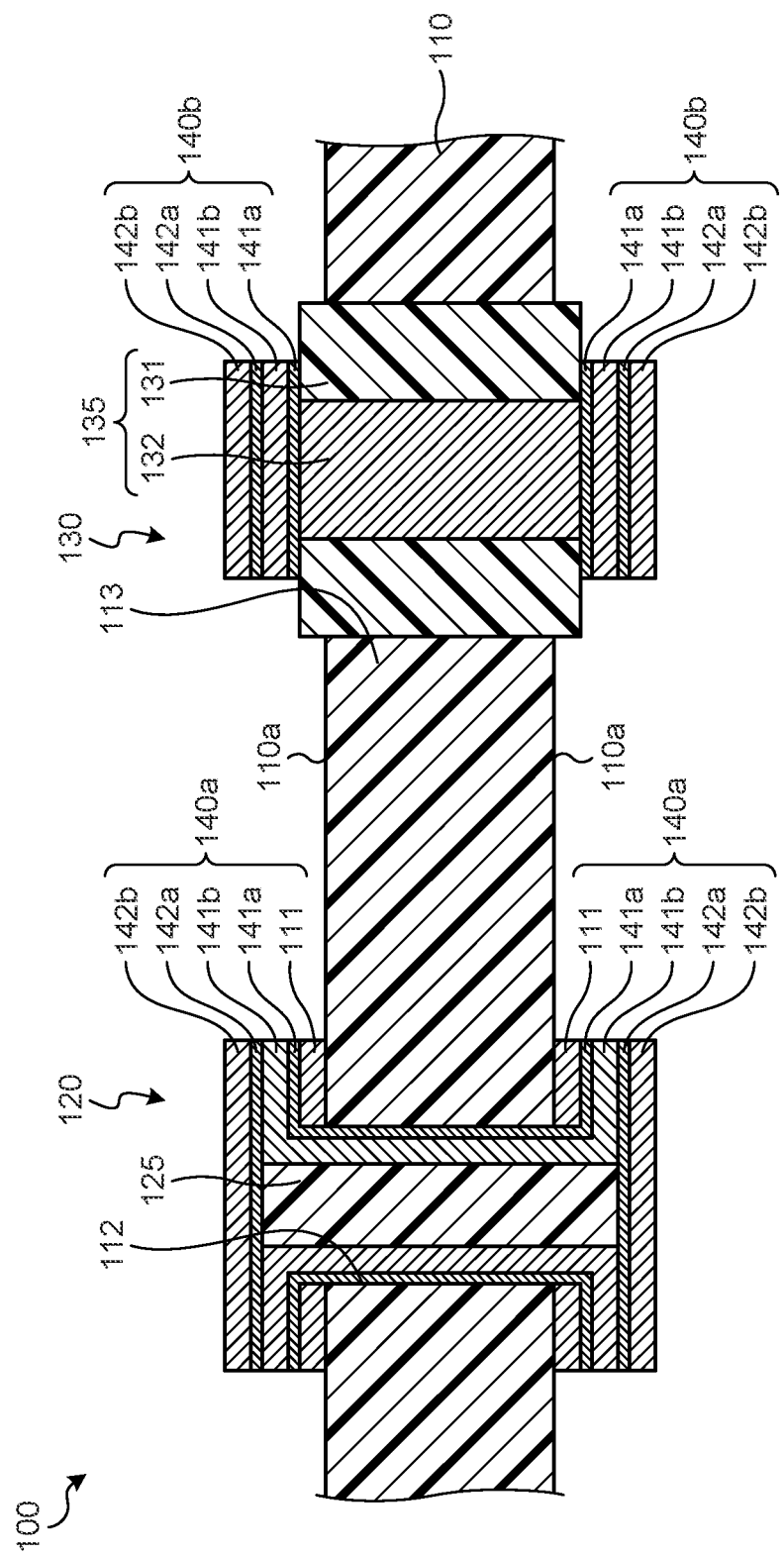
FIG. 33 is a diagram illustrating a core substrate according to a modification of the first embodiment.

Meanwhile, in each of the embodiments as described above, the conductor layers 140b cover the entire end faces of the magnetic member 135, but the conductor layers 140b need not always cover the entire end faces of the magnetic member 135. Specifically, as illustrated in FIG. 33 for example, a part of the end faces of the magnetic member 135 of the core substrate 100 according to the first and the third embodiments need not be covered by the conductor layers 140b. Specifically, in FIG. 33, the conductor wire 132 of the magnetic member 135 is covered by the conductor layers 140b, but a part of the magnetic body 131 is exposed without being covered by the conductor layers 140b. In this case, the conductor layers 140b include the first electroless plating films 141a, the first electroplating films 141b, the second electroless plating films 142a, and the second electroplating films 142b.

Figure 34:
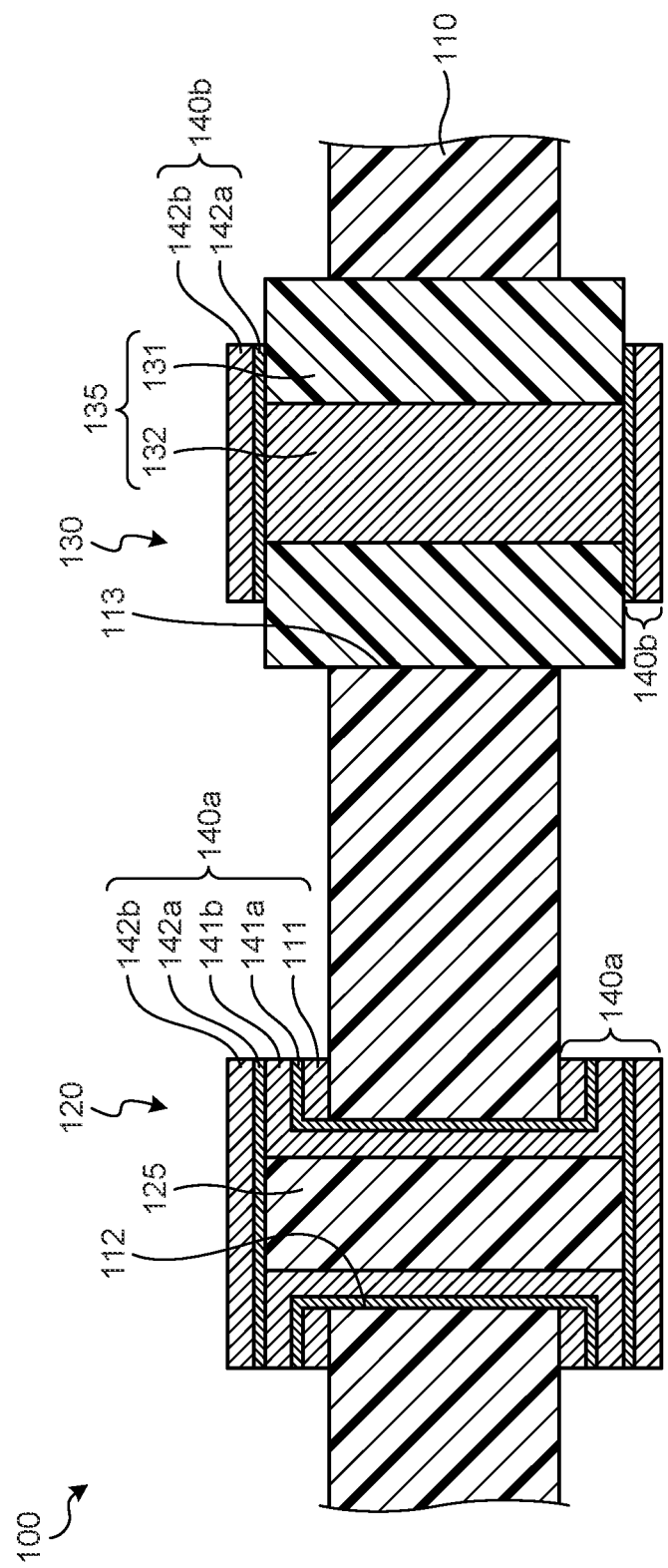
FIG. 34 is a diagram illustrating a core substrate according to a modification of the second embodiment.

Similarly, as illustrated in FIG. 34 for example, a part of the end faces of the magnetic member 135 of the core substrate 100 according to the second embodiment need not be covered by the conductor layers 140b. Specifically, in FIG. 34, the conductor wire 132 of the magnetic member 135 is covered by the conductor layers 140b, but a part of the magnetic body 131 is exposed without being covered by the conductor layers 140b. In this case, the conductor layers 140b include the second electroless plating films 142a and the second electroplating films 142b.

The core substrate 100 in which a part of the magnetic member 135 is not covered by the conductor layers 140b may be formed by adjusting sizes of the etching resists 210. Specifically, after all of the electroless plating films and the electroplating films are formed, the etching resists 210 are formed in only portions corresponding to central portions of the end faces of the magnetic member 135, and etching is performed by using the etching resists 210 as masks. With this configuration, the electroless plating films and the electroplating films around the etching resists 210 and the metallic foils 111 are removed, so that peripheries of the end faces of the magnetic member 135 are exposed.

As described above, the conductor layers 140b that cover the end faces of the magnetic member 135 may be formed with various configurations.

According to one embodiment of the wiring board and the wiring board manufacturing method disclosed in the present application, it is possible to improve electrical characteristics of a built-in inductor.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
a base material that has metallic foils formed on opposite surfaces thereof;
a through hole that is formed in the base material between the opposite surfaces of the base material;
a magnetic member that is embedded in the through hole; and
a plating film that covers end faces of the magnetic member, the end faces being exposed from the through hole, wherein
the magnetic member includes a conductor wire that is covered by a magnetic body,
the end faces of the magnetic member are polished surfaces that are flush with surfaces of the metallic foils, and
both ends of the magnetic member respectively protrude from the opposite surfaces of the base material with the magnetic member embedded in the through hole, the ends of the magnetic member respectively including the end faces of the magnetic member.

2. The wiring board according to claim 1, wherein in the end faces of the magnetic member, end portions of the conductor wire are exposed from the magnetic body.

3. The wiring board according to claim 1, wherein the magnetic body is insulating resin containing magnetic particles.

4. The wiring board according to claim 1, wherein the magnetic body is a magnetic metal plating film made of a magnetic metal.

5. The wiring board according to claim 1, wherein the magnetic member includes
a strand wire that is formed by twisting a plurality of conductor wires together, the conductor wires being covered by magnetic bodies; and
insulating resin that covers the strand wire.

6. The wiring board according to claim 1, wherein the plating film includes
an electroless plating film that covers the end faces of the magnetic member; and
an electroplating film that is laminated on the electroless plating film.

7. The wiring board according to claim 1, wherein the plating film includes
a first electroless plating film that covers the opposite surfaces of the base material;
a first electroplating film that is laminated on the first electroless plating film;
a second electroless plating film that covers a surface of the first electroplating film and the end faces of the magnetic member; and a second electroplating film that is laminated on the second electroless plating film.

8. The wiring board according to claim 1, wherein the plating film covers a part of the end faces of the magnetic member and exposes another part of the end faces of the magnetic member.

9. The wiring board according to claim 1, further comprising:
    another through hole that is formed in the base material between the opposite surfaces of the base material; and
    insulating resin that is filled in the other through hole, wherein
    the plating film includes
        a first plating film that is located between an inner wall surface of the other through hole and the insulating resin; and
        a second plating film that covers end faces of the insulating resin, the end faces being exposed from the other through hole.

10. The wiring board according to claim 1, further comprising:
    insulating resin that is located between an inner wall surface of the through hole and the magnetic member.

11. The wiring board according to claim 1, further comprising:
    an insulating layer that is arranged on the opposite surfaces of the base material;
    a wiring layer that is arranged on a surface of the insulating layer; and
    a via wire that is arranged in the insulating layer, wherein the wiring layer is connected to the plating film via the via wire.

12. The wiring board according to claim 1, wherein in the end faces of the magnetic member, each of end faces of the conductor wire is flush with each of end faces of the magnetic body.

13. A wiring board manufacturing method comprising:
    forming a through hole in a base material that has metallic foils formed on opposite surfaces thereof, the through hole extending between the opposite surfaces of the base material;
    forming a magnetic member by covering a conductor wire by a magnetic body, the magnetic member being formed so that a length between opposite end faces of the magnetic member is greater than a thickness of the base material between the opposite surfaces of the base material;
    embedding the magnetic member in the through hole with both ends of the magnetic member respectively protruding from the opposite surfaces of the base material, the ends of the magnetic member respectively including the end faces of the magnetic member; and
    forming a plating film that covers end faces of the magnetic member, the end faces being exposed from the through hole, wherein
    the wiring board manufacturing method further comprises polishing the end faces exposed from the through hole such that the end faces are flush with surfaces of the metallic foils after the magnetic member is embedded in the through hole before the plating is formed.

14. The wiring board manufacturing method according to claim 13, wherein
    the forming the through hole includes forming the through hole and another through hole in the base material; and
    the forming the plating film includes forming the plating film that covers the end faces of the magnetic member exposed from the through hole and an inner wall surface of the other through hole.

15. The wiring board manufacturing method according to claim 14, further comprising:
    filling insulating resin in the other through hole in which the plating film is formed.

16. The wiring board manufacturing method according to claim 13, further comprising:
    forming another through hole in the base material after the magnetic member is embedded in the through hole, wherein
    the forming the plating film includes forming the plating film that covers the end faces of the magnetic member exposed from the through hole and an inner wall surface of the other through hole.

17. The wiring board manufacturing method according to claim 16, further comprising:
    filling insulating resin in the other through hole in which the plating film is formed.

18. A wiring board comprising:
    a base material;
    a through hole that is formed in the base material between opposite surfaces of the base material;
    a magnetic member that is embedded in the through hole; and
    a plating film that covers end faces of the magnetic member, the end faces being exposed from the through hole, wherein
    the magnetic member includes a conductor wire that is covered by a magnetic body,
    in the end faces of the magnetic member, each of end faces of the conductor wire is flush with each of end faces of the magnetic body, and
    both ends of the magnetic member respectively protrude from the opposite surfaces of the base material with the magnetic member embedded in the through hole, the ends of the magnetic member respectively including the end faces of the magnetic member.

19. The wiring board according to claim 18, wherein the magnetic body is insulating resin containing magnetic particles.

20. The wiring board according to claim 18, wherein the magnetic body is a magnetic metal plating film made of a magnetic metal.

21. The wiring board according to claim 18, wherein the magnetic member includes
    a strand wire that is formed by twisting a plurality of conductor wires together, the conductor wires being covered by magnetic bodies; and
    insulating resin that covers the strand wire.

22. The wiring board according to claim 18, wherein the plating film includes
    an electroless plating film that covers the end faces of the magnetic member; and
    an electroplating film that is laminated on the electroless plating film.

23. The wiring board according to claim 18, wherein the plating film includes
    a first electroless plating film that covers the opposite surfaces of the base material;
    a first electroplating film that is laminated on the first electroless plating film;
    a second electroless plating film that covers a surface of the first electroplating film and the end faces of the magnetic member; and
    a second electroplating film that is laminated on the second electroless plating film.

24. The wiring board according to claim 18, wherein the plating film covers a part of the end faces of the magnetic member and exposes another part of the end faces of the magnetic member.

\* \* \* \* \*